(12) United States Patent
Majumder et al.

(10) Patent No.: US 8,711,177 B1
(45) Date of Patent: Apr. 29, 2014

(54) GENERATION, DISPLAY, AND MANIPULATION OF MEASUREMENTS IN COMPUTER GRAPHICAL DESIGNS

(75) Inventors: Chayan Majumder, Delhi (IN); Donald J. O'Riordan, Sunnyvale, CA (US); Harindranath Parameswaran, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 372 days.

(21) Appl. No.: 13/034,571

(22) Filed: Feb. 24, 2011

(51) Int. Cl.
*G09G 5/00* (2006.01)

(52) U.S. Cl.
USPC .......................................... 345/636; 345/619

(58) Field of Classification Search
USPC ........................................................ 345/636
See application file for complete search history.

(56) References Cited

U.S. PATENT DOCUMENTS

| | | | | |
|---|---|---|---|---|
| 4,855,939 A * | 8/1989 | Fitzgerald et al. | ............. | 345/419 |
| 5,701,403 A * | 12/1997 | Watanabe et al. | ............. | 345/419 |
| 5,894,310 A * | 4/1999 | Arsenault et al. | ............. | 345/679 |
| 6,134,338 A * | 10/2000 | Solberg et al. | ................. | 382/113 |
| 6,256,595 B1 * | 7/2001 | Schwalb et al. | .................. | 703/1 |
| 6,992,685 B2 * | 1/2006 | Hallbauer et al. | ............. | 345/619 |
| 7,076,412 B1 * | 7/2006 | Davis | .................. | 703/7 |
| 7,130,774 B2 * | 10/2006 | Thomas et al. | .................. | 703/1 |
| 7,705,861 B2 * | 4/2010 | Mielke | ........................... | 345/642 |
| 2002/0118229 A1 * | 8/2002 | Batori et al. | ................... | 345/771 |
| 2003/0125901 A1 * | 7/2003 | Steffey et al. | ................. | 702/155 |
| 2009/0307583 A1 * | 12/2009 | Tonisson | ....................... | 715/246 |
| 2010/0182312 A1 * | 7/2010 | Mitani et al. | .................. | 345/419 |

\* cited by examiner

*Primary Examiner* — M Good Johnson
(74) *Attorney, Agent, or Firm* — Sawyer Law Group, P.C.

(57) ABSTRACT

Display of measurements in a graphical design on a computer system. In one aspect, shapes are displayed in an image, and a definition of a defined area of the image is received. One or more measurements are determined for one or more of the shapes displayed within the predefined area, the one or more measurements determined automatically without a user designating endpoints for the measurements. The one or more measurements are displayed as being associated with the one or more shapes.

33 Claims, 12 Drawing Sheets

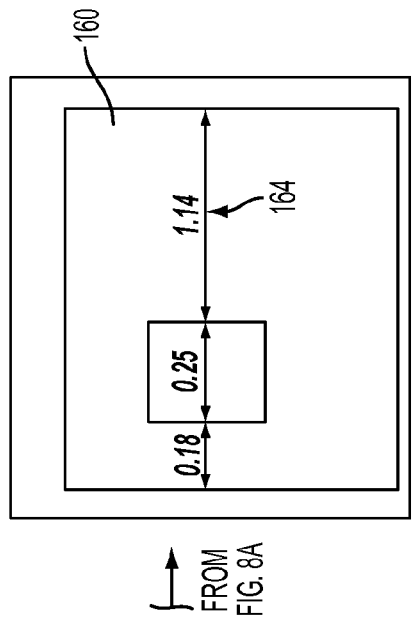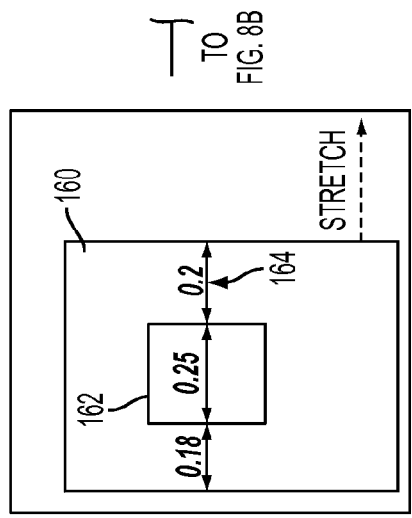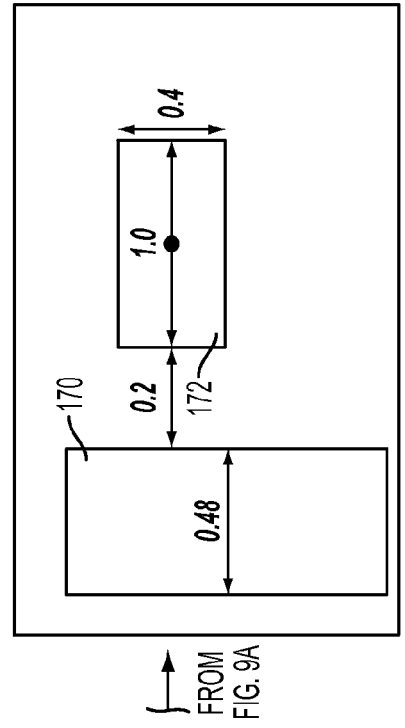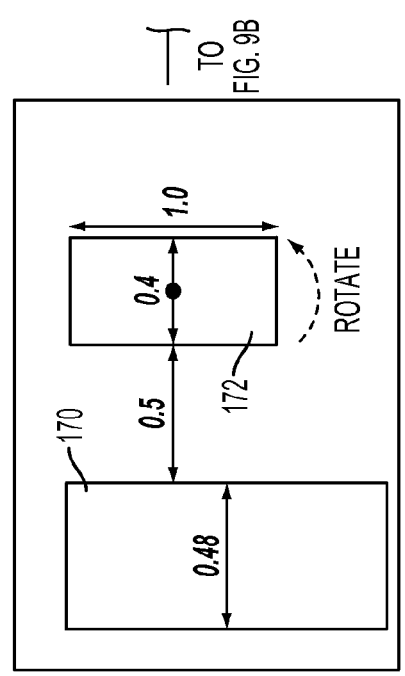

GENERATION, DISPLAY, AND MANIPULATION OF MEASUREMENTS IN COMPUTER GRAPHICAL DESIGNS

FIELD OF THE INVENTION

The present invention relates to graphical display by computer systems, and more particularly to displaying graphical measurement information in graphical designs using a computer system.

BACKGROUND OF THE INVENTION

Computer-enabled graphical display and editing systems are used in a wide variety of different applications and industries to view and edit different types of visual images and designs on computer systems or other electronic devices. One common application is electronic design automation, including such applications as layout design, in which the designs for components and spatial layout of electronic components such as integrated circuits and circuit boards are viewed, created and edited using displayed images in graphical software applications. Custom layout design involves rapid manual activity of a designer, where productivity is the key. Improvements in designer productivity, especially involving the more repetitive activities, lead to substantial decrease in design turn-around-time and increase in user satisfaction.

When using existing layout editors, designers must often check the dimensions and spacing of shapes in a layout, e.g. view measured distances and lengths of edges or other representations of physical dimensions of the shapes, including objects, areas, or other features in the design, and/or view the spacing measurements of shapes relative to other shapes. For example, in some situations, the designer is working under design constraints and requirements in which shapes must conform to predetermined minimum tolerances in their dimensions and positions, and the designer needs to see distance measurements to see if and how closely the requirements are being met. In another example, the designer may need to know particular measurements to determine whether new or edited shapes will fit at a desired area or location. Determining distance measurements between design features is a critical aspect of many types of designs, not least electronic device designs in which components must be squeezed into areas of ever-decreasing size and miniaturization, e.g., to decrease manufacturing cost and power consumption of electronic devices.

In one example of a design for which a designer desires to determine distance measurements, FIG. 1 shows a portion of an electronic design layout 10 as graphically displayed on a computer display screen. The layout includes several shapes organized on different layers of the design. For example, two MOS transistors 12 are shown. At this point, the designer wishes to check the distance measurements of and between multiple shapes, enclosures, overlap values, and other features in order to ensure he has met all the intended dimensional and spacing requirements of the design. If the result of this check shows that some dimensions and/or spacing are not within the requirements, the designer may have to make further adjustments to the shape dimensions, spacing values, etc.

In a layout such as in the example of FIG. 1, there may be numerous such distance measurements the designer is interested in, such as tens or hundreds. In currently-used electronic design software, the designer must manually specify a measurement (e.g., a "ruler") between two specified edges or points of shapes for each measurement he wishes to be displayed. The software displays the value of the measurement once the two endpoints of the ruler are specified by the designer. He or she must draw each of these rulers manually, one at a time, making sure the ruler is precisely placed on both the start and destination edges. To specify such precise graphical rulers, he or she also needs to perform a lot of zoom operations to accurately place the endpoints of the rulers at edges. Some design software may allow "snapping" an endpoint of a ruler to an edge, but in many designs there are numerous edges that are positioned very close to each other, so that numerous zooming operations are still required to precisely select desired edges. Indeed, log file analysis of actual design operations has shown that zoom and ruler operations are by far the most frequently used commands, and very often invoked together, i.e., zooms performed during a ruler operation. Thus, manual placement of rulers in a graphical design involves numerous operations and is often a major productivity bottleneck.

Furthermore, after a user has drawn all the rulers manually in the design, the user may want to alter some of the dimensions and/or positions of shapes or other features of the design. However, in current design software, the rulers display static measurements, and so any changes to shapes would cause corresponding displayed rulers to become incorrect. Therefore, once the designer alters the shapes, he or she is required to re-draw the rulers corresponding to the alterations to make sure that the alterations have met the intended measurement requirements. This again has significant impact on productivity.

SUMMARY OF THE INVENTION

The inventions of the present application relate to displaying graphical measurement information in graphical designs using a computer system. In one aspect, a method for displaying measurements in a graphical design using a computer system includes causing a display of an image on a display device and a plurality of shapes in the image. A definition of a defined area of the image is received from a user. One or more measurements are determined with a processor for one or more of the shapes displayed within the defined area, the one or more measurements determined automatically without a user designating endpoints for the measurements. A display is caused by the processor of the one or more measurements on the display device, the one or more measurements displayed as being associated with the one or more shapes. A similar aspect is provided for a computer program product comprising a computer readable medium including program instructions for implementing similar features, and for a system providing similar features.

In another aspect, a method for displaying measurements in a graphical design using a computer system includes causing a display of an image on a display device and a plurality of shapes in the image. One or more measurements are stored for one or more associated shapes of the plurality of shapes. A display is caused by a processor of at least one measurement of the one or more measurements on the display device, wherein the display of the at least one measurement is based at least in part on a set of defined design rules for the design.

The embodiments described herein allow a user to work efficiently within a graphical interface and design image by providing displayed measurements for shapes in the design. Various embodiments described herein include embodiments providing automatically-generated measurements, filtered or altered displayed measurements according to user preferences or defined rules, and reduction of displayed visual clutter caused by measurements, thereby providing the user with desired information about features of the design and leading to greater design efficiency and user satisfaction.

BRIEF DESCRIPTION OF THE FIGURES

FIGS. 8A and 8B are diagrammatic illustrations of one type of modification to a displayed shape and measurements;

FIGS. 9A and 9B illustrate another type of modification to a displayed shape and the its measurements;

DETAILED DESCRIPTION

Figure 1:
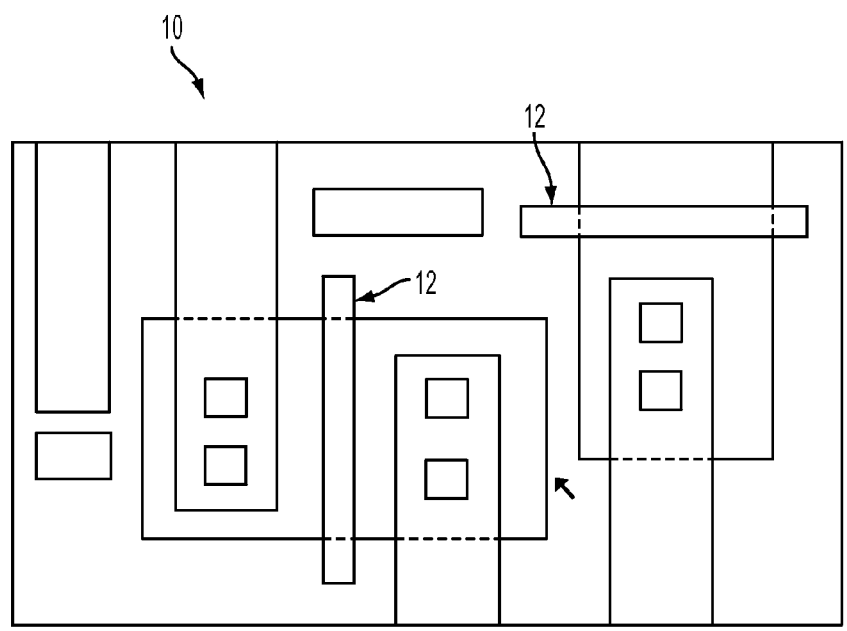
FIG. 1 is a diagrammatic illustration of a displayed graphical design suitable for use with displayed measurements.

The present inventions relate to graphical display by computer systems, and more particularly to displaying graphical measurement information in graphical designs using a computer system. The following description is presented to enable one of ordinary skill in the art to make and use the inventions and is provided in the context of a patent application and its requirements. Various modifications to the preferred embodiment and the generic principles and features described herein will be readily apparent to those skilled in the art. Thus, the inventions are not intended to be limited to the embodiments shown but are to be accorded the widest scope consistent with the principles and features described herein.

The embodiments herein are mainly described in terms of particular methods and systems provided in particular implementations. However, one of ordinary skill in the art will readily recognize that these methods and systems will operate effectively in other implementations. For example, the system implementations can take a number of different forms. Embodiments will also be described in the context of particular methods having certain steps. However, the embodiments operate effectively using other methods having different and/or additional steps not inconsistent with the embodiments and claims disclosed herein.

Embodiments herein can take the form of a software embodiment, a hardware embodiment, or an embodiment containing both hardware and software elements. A software embodiment can include but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk read only memory (CD-ROM), compact disk read/write (CD-R/W), DVD, and Blu-Ray™.

The embodiments disclosed herein allow users to accurately evaluate design features such as shapes in displayed images by displaying measurements for shapes and spaces between shapes, promoting greater efficiency and productivity. Embodiments allow users to view or determine measurement information in an efficient manner that requires relatively little extra input or time from the user.

To more particularly describe the features of the present invention, please refer to FIGS. 2-15 in conjunction with the discussion below.

Figure 2:
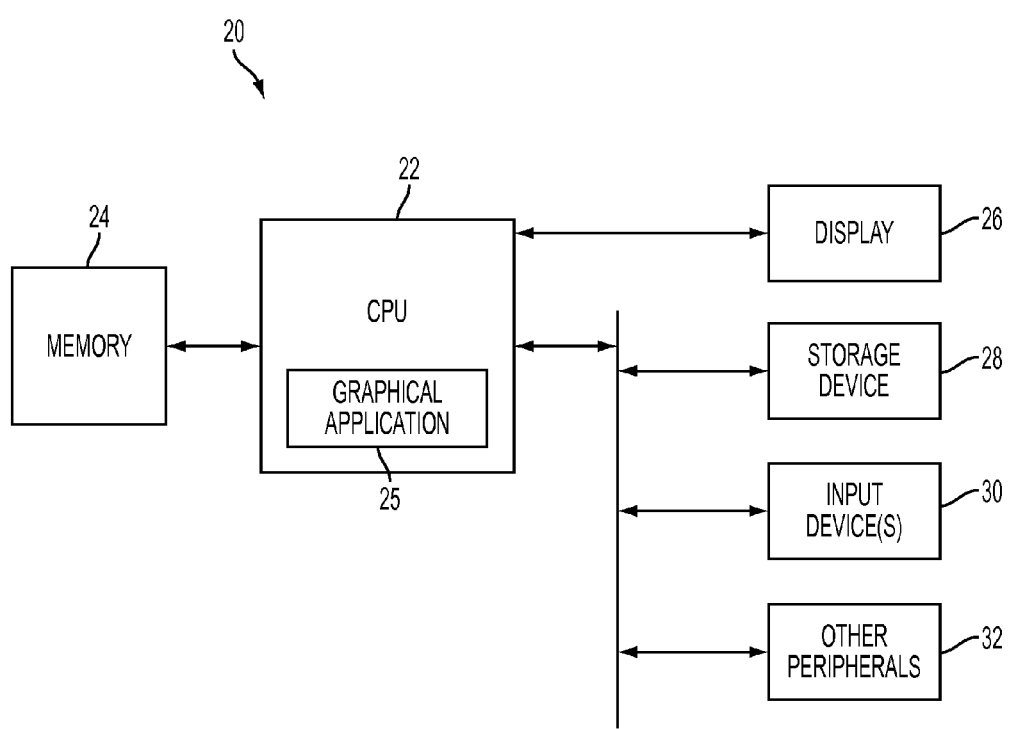
FIG. 2 is a block diagram illustrating a system suitable for use with the present inventions.

FIG. 2 is a block diagram illustrating a system 20 suitable for use with the present invention. System 20 can be a suitable computer system, server, or other electronic or hardware device. For example, the system 20 can be a mainframe computer, desktop computer, workstation, portable computer, or electronic device (set-top box, portable device, cell phone, personal digital assistant, media player, game device, etc.). System 20 includes a CPU 22, memory 24, display device 26, storage device 28, input device(s) 30, and other peripherals 32.

CPU 22 can be one or more microprocessors, other processors, processing circuitry, logic circuitry, etc. to execute program code and control basic operations of the system 20, including processing operations, manipulating data, issuing commands to other components of the system 20, etc. For example, an operating system can run on the system 20 and is implemented by the microprocessor 22 and other components of the system 20. CPU 22 can also implement a graphical design application 25 such as an editing software tool used for the present embodiments, as described further below.

Memory 24 is typically provided in system 20 for access by the CPU 22, and can include one or more of a variety of types, such as random access memory (RAM), read-only memory (ROM), Electrical Erasable Read-only Memory (EEPROM), Flash memory, etc.

Display device 26 outputs displayed images to a user of the system 20. Display device 26 can be any of a variety of types of displays, including LCD, OLED, plasma, CRT, etc. Some implementations of the display device 26 include a screen having a screen size, e.g., an area within which images are displayed. In some embodiments, the CPU 22, and/or a different processor in communication with the display device, can cause the display of images on the display device by providing the appropriate signals to well-known components of system 20 used in displaying images on device 26. Storage device 28 can store data that may be retrieved by the CPU (including program instructions and/or data for graphical application 25), and can be any of a variety of devices such as a hard disk, CD-ROM, DVD-ROM, Blu-Ray disc, magnetic tape, etc. Input devices 30 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 32 can include any other devices connected to and used by the system 20, such as any peripheral, card, component, or interface device that performs one or more functions and communicates with the system 20, such as network adapters that enable the system 20 to become coupled to other computer systems or devices through intervening private or public networks, scanners, printers, sensors, speakers, etc. In the example of FIG. 2, the display device 26 is connected to the CPU 22 by its own dedicated bus, while storage device 28, input devices 30, and other peripherals 32 are connected to a common bus that is also connected to the CPU. In other embodiments, the display device 26 and other devices can each have their own bus, or share one or more common buses. One or more of the buses or other links can be implemented using wires or wirelessly, according to any of well known standards and protocols.

The graphical application 25 and interface including the embodiments described herein can be implemented by the CPU 22 (or other processor) to cause the display of one or more images and/or interface on the display device 26 and receive input from one or more of the input devices 32 to control the functions of the application and interface. The application 25 can also be stored on storage device 28 and/or in memory 24. Some of the functionality of application 25 is described in greater detail below.

Figure 3:
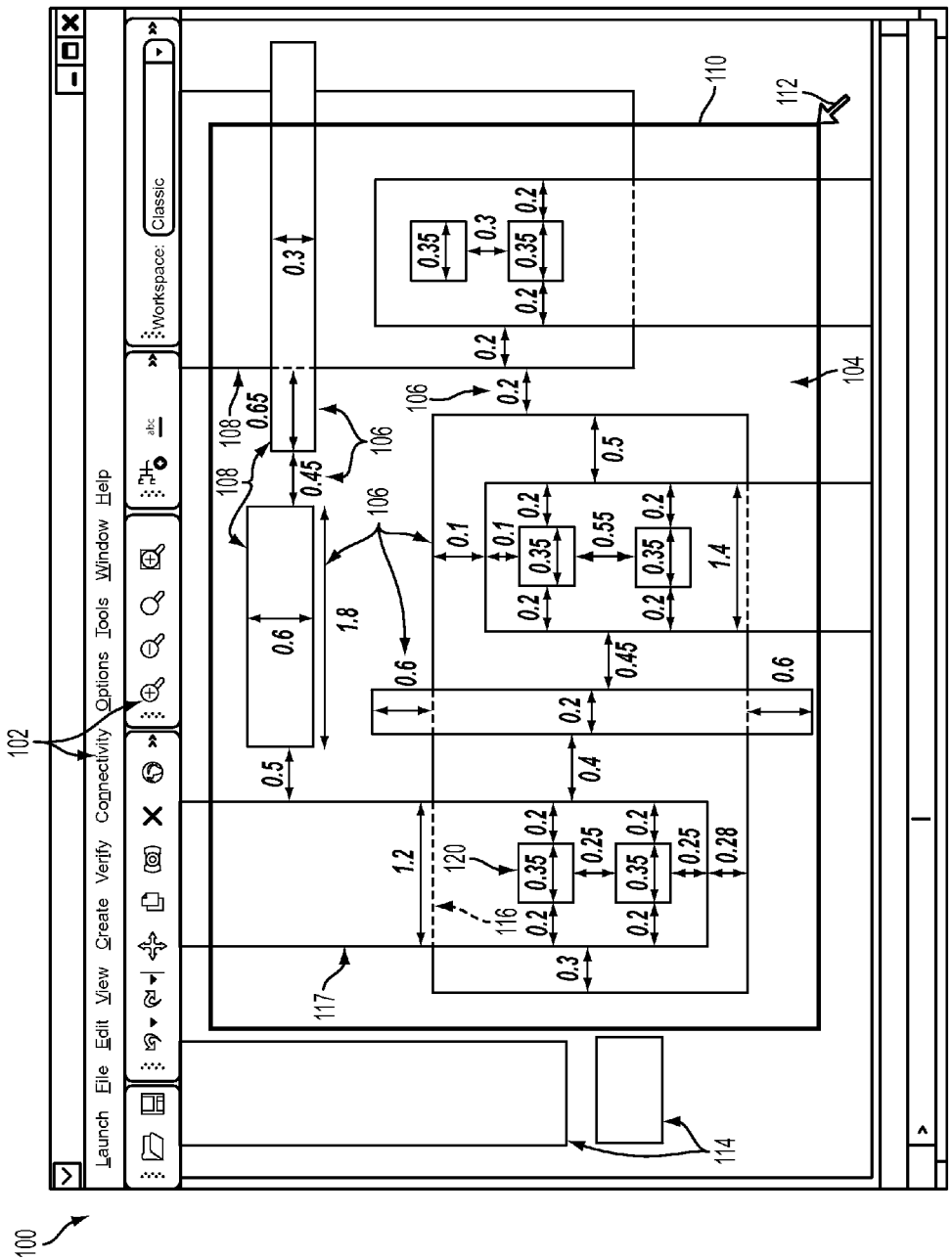
FIG. 3 is a diagrammatic illustration of an example embodiment of a graphical interface and displayed image of a layout canvas suitable for use with the present inventions.

FIG. 3 is a diagrammatic illustration of an example embodiment 100 of a displayed graphical interface for a viewing and editing application 25 suitable for use with the embodiments disclosed herein. The interface 100 is shown as a displayed window within a graphical user interface, but can be displayed in other forms in other interfaces. In the displayed interface 100, various controls 102 are displayed such as menu items and buttons which allow the user to select various viewing and editing functions of the application and interface 100.

The interface 100 displays a main image 104 which is created and/or edited by the user with functions of the interface 100. The image 104 displayed in the interface 100 can be part of a complete, larger image or "canvas" (i.e., displayable or editable work area, or complete set of data of interest to the user) that is stored in the memory 24 or other data storage of the system 20, where only part of the complete canvas is displayed in the interface 100 at one time. Alternatively, or at other zoom levels, the image 104 can be the complete canvas. For example, after selecting a zoom function of the interface 100, the canvas is displayed at a lower level, i.e., zoomed in so that the details of the image 104 are displayed larger. After a sufficient degree of zoom-in, only part of the canvas is displayed in the interface 100 as image 104.

In the example embodiments shown herein, a layout design application is being used on system 20 and provides the interface 100. This application allows designers to create and edit layouts for integrated circuits, circuit boards, or other electronic designs (and may have many other functions, not detailed here). For example, the layout design application of interface 100 displays an image 104 which can be the entire layout or canvas for the layout design, or only a displayed part of the canvas, and which depicts an integrated circuit layout displayed having various graphical "shapes" that represent various components such as regions (e.g. semiconductor regions), electrical traces, vias for connecting different layers, and/or other electronic components. The user can create, add, delete, or modify the shapes in the image 104 and canvas, which in some embodiments causes creation or modification of a data model of these components that corresponds to the displayed images. However, many other different applications and programs can be used with the embodiments described herein. For example, schematics viewing and editing, as well as editing and viewing of other graphical images, maps, plans, or diagrams, can be suitable for use with the inventive embodiments herein.

In other embodiments, other types of images can be displayed in interface 100 for other applications instead of layout design. For example, line drawings, graphical shapes, photo images, maps, or other images can be displayed, created and/or edited similarly to the layout image 104 described above. Such other embodiments and applications also may use one or more measurement display embodiments described herein and thus can also benefit from the present inventions.

In the example of FIG. 3, a graphical layout of a circuit is displayed at a particular zoom level showing a portion of the layout. In some embodiments, the "connectivity" of the layout has been specified and is known by the application software, i.e. the software has recorded how each shape or subset of shapes of the canvas is connected to the other shapes of the canvas, and in some embodiments knows the types, functions, and/or other characteristics of the shapes. The connectivity can be represented using connectivity information in any desired form, which in general identifies the shapes and describes or represents electrical connectivity of the shapes.

In the example of FIG. 3, measurements 106 are displayed between certain edges of the various shapes 108 or other areas displayed in the image 104. Each measurement 106 includes a measurement line and an indicator of a magnitude shown by the measurement line, such as a numeric value. The measurement line can be any line or set of lines, such as a double sided arrow, provided between two edges (or other features) of shapes displayed in the design. In other embodiments, other measurement lines can be displayed, such as a solid, dotted, broken, or dashed line, arrows provided along a line, animations showing the distance with movement, flashing, or other indication, etc. The value can represent the distance between the edges as indicated by the measurement line. The value can be in any desired units, and in some embodiments the units can be displayed in addition to the value. In other embodiments, the value can represent a different magnitude, such as an angle, circumference, etc. In still other embodiments the indicator can be a function, variable, etc. The size of the displayed value for the measurement can be user-specified if desired. The size can also be adjusted based on the distance of the measurement, e.g., the displayed value can be automatically reduced in size to fit within a particular area without overlapping other measurements or shapes.

According to some embodiments described herein, the measurements associated with displayed edges or shapes are automatically displayed in the image 104 without any additional user input required. For example, the user does not have to input the endpoints of the measurements for the measurements to be determined and displayed. In some embodiments, the user is allowed to provide a definition of a "measurement area" to the system using an input device, such as dragging a mouse or other pointing device to draw a rectangle or other-shaped area on the display. Multiple measurements are automatically determined and displayed in the defined measurement area. For example, the measurements can be displayed between every adjacent parallel edge of shapes that are within the measurement area. In the example shown, every shape has edges parallel to either the horizontal (X) axis or vertical (Y) axis. The measurements are displayed as perfectly aligned to the edges of their associated shapes.

In the example of FIG. 3, the user has drawn a measurement area 110 by dragging the mouse and controlled cursor 112 to cover a desired area of the image 104 displayed in the interface 100. Shapes within this area 110 are provided with automatic measurements 106 for the edges within the area 110, while any edges completely outside the area 110 (such as edges of shapes 114) are not provided with any displayed measurements. The bounding box or perimeter of the measurement area 110 can be rectangular or provided as other shapes in other embodiments, and can be displayed on the screen, or not, as preferred by the user.

As a default, the displayed measurements 106 are generated and shown inside the measurement area 110 between every pair of adjacent parallel edges (not all measurements between parallel edges in the defined area are shown in the example of FIG. 3, but may be displayed in other embodiments.) The measurement line (e.g. arrow) of each measurement is displayed between and perpendicular to the pair of edges at the center of the common parallel run length of the pair of associated edges. In other embodiments, the measurement line can be displayed at other locations between the two edges. The process component (e.g., software component) that provides the automatic displayed measurements described herein can be in communication with the design application and/or operating system displaying the interface 100. This component auto-detects adjacent parallel edges located inside the measurement area 110, and auto-computes the distance between each pair of adjacent edges perpendicular to those edges. This is performed using the position information known from the design, where each shape in the design has coordinates and other related information describing its dimensions and position. Using this information, the process component generates and displays the measurements 106 for the shape edges.

Different embodiments can use different criteria for determining whether to display measurements, or associated edges or shapes, partially within the measurement area. For example, some embodiments can display a measurement to any edge at least partially within the measurement area, or display a measurement between any pair of edges in which at least one of the edges is within the measurement area, such that the measurement may extend to another edge outside the measurement area. Different embodiments can consider an edge within the area only if a majority of its displayed length is within the area, or only if all of the displayed edge is within the area. In another embodiment, a measurement is only displayed if the entire measurement line is displayed completely within the measurement area, i.e., both edges must be located within the measurement area 110 for the measurement to be displayed.

Some edges may be hidden beneath other shapes or areas in the particular view of the design shown in image 104, and can be displayed as hidden lines. For example, the edge 116 under the shape 117 can be displayed as a dotted line so that a measurement can be displayed associated with it as shown (measurement line displayed parallel alongside the hidden edge or pointing perpendicularly to it). Such layer completion lines can be dotted lines, lines of different colors, or otherwise marked as different than the viewable edges, and in some embodiments need only be displayed for edges having an associated displayed measurement. In other embodiments, all the hidden edges can be represented by layer completion lines regardless of associated displayed measurement.

Reducing the visual clutter and potential confusion that results from having many and congested displayed measurements is an important consideration in many embodiments described herein. In some embodiments, redundant measurements are automatically not displayed on the screen to minimize or significantly reduce the number of measurements that are displayed. For example, if a shape is a perfect square, then a measurement is displayed for only one of the four edges of that shape. Thus, in the example of FIG. 3, the square contact shape 120 has only one horizontal measurement displayed for it, and the vertical (top-to-bottom) measurement is not displayed. In some embodiments, a measurement may be desired to be omitted when it can be deduced from other displayed measurements. \

In some embodiments, measurements can also be automatically displayed between non-parallel edges, non-linear edges, and/or between other features of the design that are not edges. For example, there may be shapes having non-parallel edges to the X or Y axes, in which case a measurement can be automatically displayed parallel to the X or Y axis from the most extreme point or portion of those shapes. In one example, a shape having right-angled sides is positioned such that the sides are angled with respect to the X and Y axes, and a vertex between the two sides is the most extreme point of the shape in the positive X-direction. A Y-axis measurement can be displayed from this most extreme point to a different edge (or other feature) that is further in the positive X direction. In other embodiments a measurement line can be displayed not parallel to the X and Y axes and parallel to the edge it is measuring. In some embodiments, measurements can be displayed between other features such as between adjacent vertices of shapes or line segments, between vertices that lie within a predetermined threshold distance of each other, between adjacent center lines, etc. In one example, there may be circular or elliptical shapes, or shapes with curved surfaces, displayed in the design. In such cases, a measurement can be displayed between the extreme point on the circumference or perimeter of the shape, or the measurement can be displayed from a calculated center point or radius of a particular curved surface. Some embodiments can display non-linear or curved measurement lines; e.g., the displayed magnitude for the line can indicate a circumference or the total distance travelled by that line, or an angle swept by the line or between the designated edges.

Automatic determination and display of measurements in a graphical design assists the user in determining and visualizing the dimensions and spacing of shapes. Since the measurement information is automatically provided, the user does not have to manually input any measurements between particular shapes. Previous software, in contrast, did not display measurements automatically and required the user to manually input endpoints of measurements, one shape at a time, which was time consuming and tedious.

Flexible Smart Filtering of Displayed Measurements

In some embodiments providing displayed measurements, the user can input and/or select predetermined criteria or options to cause filtering of displayed measurements in any desired way to enhance productivity, such that only some of the possible measurements between edges (or other features) are displayed. Flexible smart filtering causes measurements to be displayed that qualify under user-specified and/or default predetermined criteria. Other embodiments can cause only measurements that do not meet predetermined criteria to be displayed. Several different types of filtering can be employed, examples of which are discussed below.

Value filtering is one type of filtering that allows the user to filter displayed measurements based on the magnitudes of the measurements, such as the magnitude value. For example, the filtering criteria can specify that measurements are displayed in response to one or more of the following conditions: that the distance between the edges of the associated edge-pair is less than a particular threshold value; that the distance between the edges is greater than a threshold particular value; and/or that the distance between the edges lies within a particular predefined range, between two threshold values. The values or ranges can be specified by the user or other entity, or may have default values.

Figure 4:
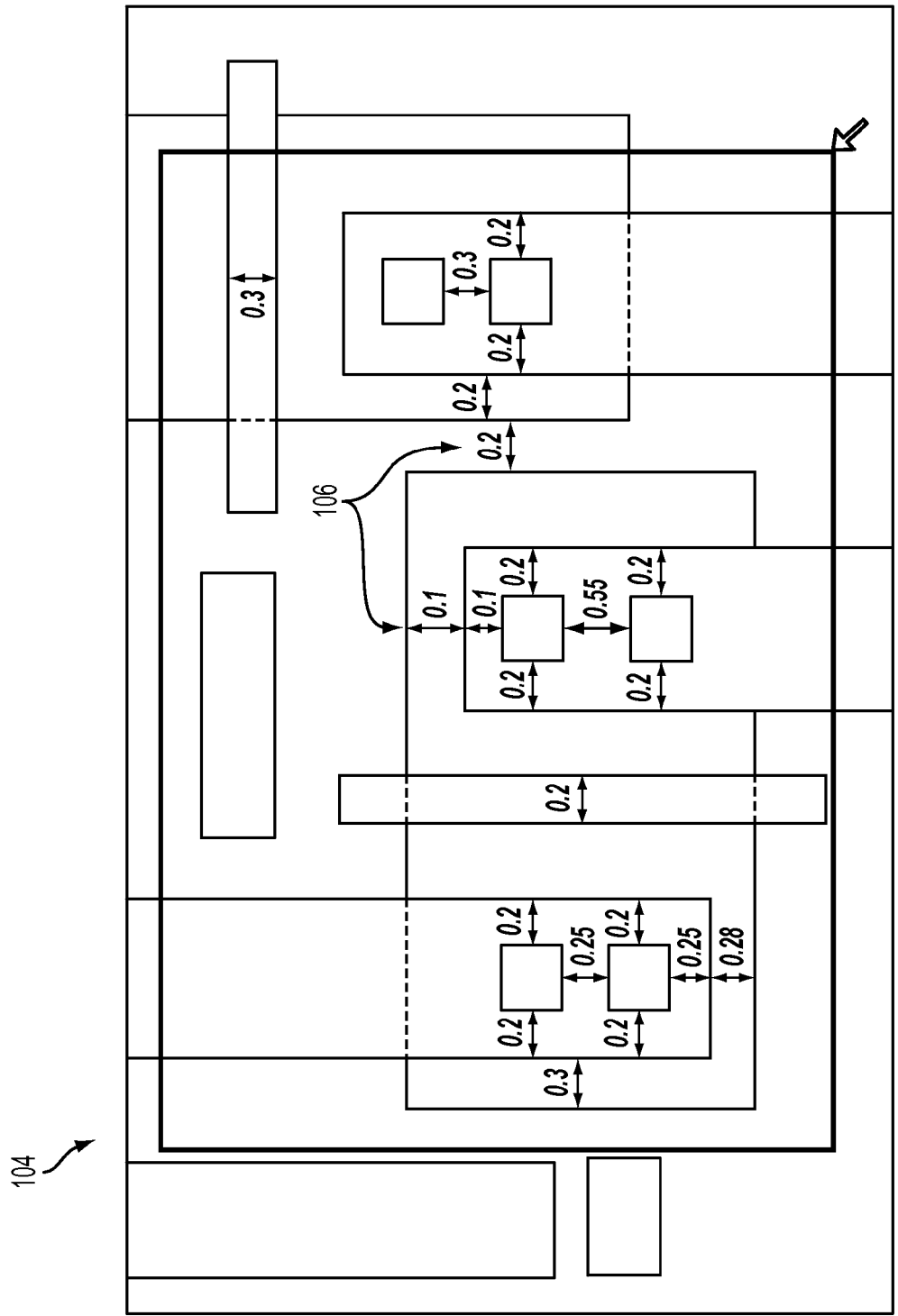
FIG. 4 is a diagrammatic illustration of one example of flexible smart filtering of displayed measurements.

FIG. 4 is a diagrammatic illustration of image 104 demonstrating one example of flexible smart filtering of displayed measurements. In the display of FIG. 4 the user has set a condition that the measurements 106 are displayed for measurements that have a magnitude less than or equal to a threshold value of 0.3. Thus, only the qualifying measurements are displayed while measurements having greater distance values are not displayed.

An advantage of flexible value filtering is that a user can filter which measurements are displayed as per his or her current need, and can easily change the filtering to display other measurements as needed. For example, some types of features of a design may all have dimensions in a certain range of values, and so the display of measurements for these features can be easily filtered by specifying those ranges. In one example, if the user needs to see measurements displayed only for signal nets and pins having smaller dimensions, he or she can set the threshold value to a range between 0.1 and 0.6. However, if the user then wants to see displayed measurements for all the power nets and fat wires, he or she can set the filter to display measurements greater than a threshold value of 0.8. Multiple different and/or discontinuous ranges can be specified simultaneously in some embodiments, which allows a user to gradually allow additional measurements to be displayed by gradually extending the range of values and/or adding new ranges of values. These features, for example, enhance a user's ability to concentrate on particular aspects of the design as needed without the clutter of other currently-unneeded measurements being displayed and creating confusion.

Layer filtering is another type of filtering that allows a user to filter displayed measurements based on the particular layers of the design with which the measurements are associated. Each layers of a circuit layout design, for example, can include shapes connected to each other on that layer and connected to other layers of the design using vias or other connections. In other types of designs, layers can be used to organize different objects or other features.

Using a layer measurement filter, the user can, for example, specify for each layer of the design whether or not the measurements for edges of shapes on that layer are to be displayed. Measurements would then only be generated and displayed between edges located only on the layers specified. For example, if the user specifies that layer METAL_1 is "on," layer METAL_2 is "on," and layer METAL_3 is "off," then the measurements would be automatically displayed between edges within the METAL_1 layer and within the METAL_2 layer, and not displayed for edges within the METAL_3. In some embodiments the user can also specify combinations of layers, such that measurements between those layers are displayed or not. For example, it could be specified that "METAL_1-CONTACT" is "on" and "METAL_1-METAL_2" is "off," indicating that measurements are displayed between edges of the METAL_1 and CONTACT layers (and not affecting the display of measurements between edges existing within each these layers).

Some embodiments can apply measurements and/or a filter on an edge basis and the layer that each edge belongs to. Each shape can be converted to a number of edges, and each edge assigned a property indicating which layer it belongs to. In one example, when detecting two adjacent edges, it is determined which layers those edges belong to, and then table rules (see below) are examined; if display of measurements between those layers is allowed by the rules, the measurements are displayed.

In some embodiments, a "layer definition threshold table" or similar controls and status summary can be used. Such a table allows the user to define threshold values on a layer (or layer combination) basis as well as display status. For example, Table 1 shows an embodiment below:

| ENTRY | LAYER | LAYER | STATUS | THRESHOLD |
| --- | --- | --- | --- | --- |
| 1 | METAL_1 | ---- | ON | >0.4 |
| 2 | METAL_5 | * | ON | * |
| 3 | METAL_1 | CONTACT | ON | 0.2-1.1 |
| 4 | METAL_1 | METAL_2 | OFF | ---- |

The entries each show the layers that are being specified as to display status (whether measurements are to be displayed or not), and the corresponding range of values for which measurements are allowed to be displayed. Entry 1 indicates that measurements will be displayed between shape edges on layer METAL_1 (only) for measurement values greater than 0.4 units. Entry 2 indicates that measurements will be displayed between a METAL_5 edge and any other edge on any layer; hence "*" indicates "don't-care" and the threshold is also "don't-care"—i.e. all measurements are to be displayed irrespective of the distance between edges. Entry 3 indicates that measurements between METAL_1 edge and CONTACT edges will be displayed only if the distance is between 0.2 to 1.1 units. Entry 4 indicates with the "off" status that measurements are not to be displayed at all between any features (such as edges) on the layers in this entry, which are METAL_1 and METAL_2 (measurements between two edges on the METAL_1 layer are displayed based on the first entry in the table).

Thus the user can easily define the flexible filtering desired for particular layers, layer combinations, and desired value ranges. A set of precedence rules can also be specified in case of conflicts between entries. For example, in some embodiments, if there is a conflict between entries in the table, the last-specified entry in the table takes precedence.

Direction filtering is another type of filtering that allows a user to filter displayed measurements based on the direction of the measurements as they would be displayed in the image 104. For example, a user can choose to filter and display measurements that measure distances along only one or more specified directions, such as the X or Y direction, i.e. horizontal or vertical measurements. In some embodiments, the user can also specify non-orthogonal measurements to filter, such as measurements between edges along a specified angle range relative to a reference direction.

This type of filtering allows a user to again select particular measurements to display. For example, the user may be working on a metal layer which is meant primarily for vertical routing. Hence, the measurements in the X direction are something that the designer is most interested in. The user can reduce the clutter on screen by displaying only the measurements along the X direction and not the measurements along the Y direction (or any other non-X direction).

Design requirement filtering is another type of filtering that allows a user to display measurements for only the measurements that fulfill (or alternately, do not fulfill) design rule checks (DRC) or other predetermined design requirements. For example, in some layout designs, spatial design requirements are used, e.g., shapes cannot be positioned closer than a particular minimum distance that is specified in the DRC requirements. For example, processes of manufacturing may require shapes to be positioned at least a minimum distance apart to achieve acceptable functionality and/or reliability of the design when implemented physically. The design requirements may also vary based on particular types of metal for layers, or types of device or structure.

The user can choose to filter the display of measurements based on whether the measurements meet such design requirements. For example, only displayed measurements which fail the DRC requirements for the particular technology being used, e.g., less than the required DRC values, can be displayed. Alternatively, the user can choose to display the opposite: only those measurements which meet (e.g., are equal or more than) the DRC values, i.e. passed the DRC. The latter may be useful in cases where the design was initially created under relaxed requirements, and now due to space constraints, the designer wants to tighten the spaces and hence wants to see all the measurements that are more than the minimum required DRC values.

Furthermore, the user can optionally specify his or her own custom filtering requirements and values that are based on the design requirement values. For example, the user can choose to define a percentage of the DRC value as the threshold value requirement to display measurements. For example, if a minimum recommended spacing between shapes for layer METAL_1 is equal to 0.6, and the user sets the DRC percentage to 80%, then 80% of 0.6 is equal to 0.48. Measurements are then set to be displayed for any distance that is less than 0.48, or alternately more than 0.48, based on the user's preference. This allows a user to view measurements that are close to the requirements within a desired percentage, window or range. In addition, some embodiments can allow the user to further specify a range of percentages of the DRC to specify a range or band of measurements to filter (not display) or display. Using the same example values, the user can thus specify a range of 80% to 140%, which is equal to 0.48 to 0.84 units.

Indicators Related to Design Requirements

In some embodiments the user can set preferences to display other indicators related to design requirements, which allow the user to view how displayed measurements relate to (e.g., fail or meet) the design requirements.

Figure 5:
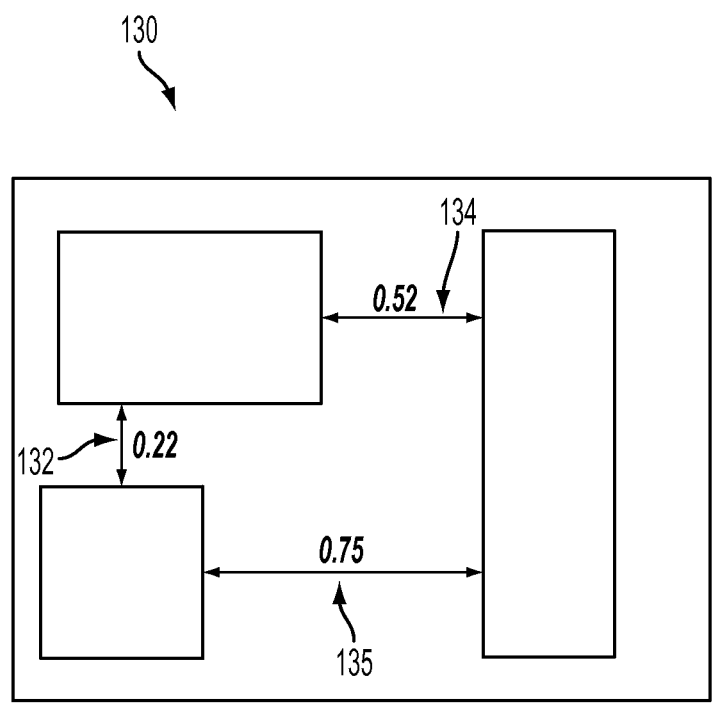
FIG. 5 is a diagrammatic illustration of an example embodiment providing indicators related to design requirements for displayed measurements.

FIG. 5 is a diagrammatic illustration of a portion of a design image 104 showing an example embodiment 130 providing indicators related to design requirements for displayed measurements, in which the system displays measurements between adjacent edges and also provides indicators as to which measurements fulfill the predetermined design requirements and which measurements do not. Indicators can also be displayed to indicate other statuses of measurements/shapes with respect to the design requirements.

For example, in the embodiment of FIG. 5, the displayed measurements are color coded. A red displayed measurement, such as measurement 132, depicts a distance that has failed the DRC value for that particular pair of edges or shapes (or has failed a custom value set by the user for that layer, etc.), e.g. it is less than the associated DRC value. A green displayed measurement, such as measurement 134, depicts a distance that meets the design requirements or custom value, e.g., it is greater than the associated DRC value.

For example, consider the previous example, in which METAL_1 minimum-spacing in the DRC is 0.6. If this is not a tight requirement, the requirement value itself has a buffer or tolerance built-in (as is often the case in layout design). The user therefore can afford to relax the requirement by +/−20% during the design process and still meet the design requirements. The user therefore sets the DRC percentage to a 80%-120% range. Assuming the original value of 0.6, this is equal to a range of 0.48-0.72. Now any measurements that lie in this range are designated to be displayed in the color green. Any measurements less than 0.48 are designated to be displayed in the color red. Furthermore, some measurements can be displayed in additional colors to indicate further statuses. For example, any measurements greater than 0.72, such as measurement 135, can be displayed in a different color, such as blue, to indicate that those measurements are above even the tolerance range and so are well above minimum requirements. Thus by viewing the displayed measurements, the user quickly knows the status of various distances between edges in the design. The colors can be customizable by the user. Furthermore, in other embodiments, different indicators than color can be displayed in the measurements and/or in addition to the measurements to distinguish the different statuses relative to the design requirements, such as dashed or dotted lines, additional icons or symbols, etc.

Some embodiments can allow the user to create various sets, scenarios or tables of custom settings or preferences for the filters and/or indicators he or she wishes to implement. For example, the user can set preferences and fill in a threshold table, and name this scenario "my_ruler_prefs_1," and assign it a bindkey on a keyboard or other input device, such as the "1" key. If the user changes one or two preferences and/or values in a table, the user can call that scenario "my_ruler_prefs_2" and assign it a bindkey of "2." In some embodiments, these bindkey settings may only be active while in a mode (such as while a particular command is active) that displays measurements or accepts user preferences. Some embodiments can allow the user to have one of these preferences in effect at any time (default preference) when he or she starts an input command, such as a mouse drag, and can switch preferences while in the middle of the mouse drag by using a bindkey. For example, the user could select a bindkey to change the design requirements from more restrictive to less restrictive, since the user knows that an area of the design is displayed in which less restrictive DRC rules are permissible. Thus, in the middle of the mouse drag, the user can change the set of displayed measurements before he or she even releases the mouse button.

In summary, an advantage of the described flexible and smart filtering mechanisms is that users can choose to see only the measurements of interest, thereby improving productivity. This also reduces clutter on screen.

Displaying design requirement indicators that indicate whether distances meet the requirements further enhances productivity. The design requirements are checked on the fly and visually displayed while the user is creating or editing the design. Furthermore, the design requirement information can be displayed for all displayed shapes on the display screen, not just a particular edited shape. This allows the user to see whether surrounding shapes meet design requirements so that the user can know instantly which operation to perform next to meet design requirements and how any changes will affect surrounding shapes. These and other features provide a significant improvement in productivity over previous design applications. For example, in previous layout applications, DRC checks were typically performed on the entire design after the user had completed the design. Therefore, the user typically had to keep in mind all the design requirements while creating or editing the design, which has become a significant burden with more recent technologies having extensive and complex design requirements.

Rule-Based Display of Measurements

The measurement display system described herein can also in some embodiments include rule-based displayed measurements, so that the measurements can be displayed in accordance with user-defined conditions and/or rules. Such rules can allow a user to specify virtually any desired display criteria, conditions, or rules for measurements. For example, users can further define complex rules using pre-defined syntax, and the displayed measurements would be generated according to the defined rules. The pre-defined syntax can include language syntax and pre-defined logical operators for layer operations.

For example consider the following example of rules for measurement display in a circuit layout design:
IF (POLY and DIFF) {
AUTO_RULER X;
AUTO_RULER Y;
}

Figure 6:
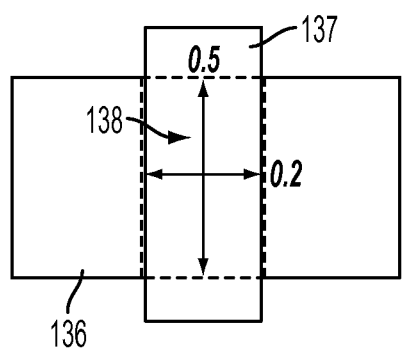
FIG. 6 is a diagrammatic illustration of an example of applying user-specified rules for displaying measurements.

These rules essentially mean that when poly and diffusion layers of the design intersect, measurements ("auto-rulers") are generated and displayed for the X and Y dimensions of the intersected area, which in this example is the gate region of a transistor device. FIG. 6 illustrates an example of the results of applying the rules above. The shape 136 is on the diffusion layer, and the shape 137 is on the poly layer. The intersected area between these two shapes is indicated with dashed lines to indicate hidden lines where appropriate, and is provided with displayed horizontal and vertical measurements 138 as shown. The measurements can be displayed in other locations in other embodiments, such as outside the intersected area. The measurements directly provide the Length and Width of the gate region (intersecting area). Thus, when user draws the measurement area for the design to include the shapes 136 and 137 and associates the above rules with this measurement area, then the above rules would be applied in the measurement area and the gate width and length would be provided with displayed measurements.

The rules for measurement display can be provided as any forms of expressions, conditions, functions, etc. as is commonly used in scripting or programming languages. For example, using the logical operations such as NOT, AND, OR, etc, and using existing design tools' ability to specify complex layer operations for specified features such as AREA, OVERLAP, ENCLOSURE, etc., users can define complex cases where they want the measurements to be displayed. In one example, there can be the following conditions and actions defined for a design. If two wires on layers Metal_1 and Metal_2 intersect, and if within 4 microns of the intersection there are vias in a 2×2 array (4 vias) on the Metal_2 layer, and if the vias are of a specified type (e.g., type M2-M3-M4 or a specific name for the type depending on the technology), then show all the vertical and horizontal rulers between the all the edges of the 4 vias. These kinds of rules can be used to auto-generate displayed measurements for these features or areas of a design when the specified conditions are met. For example, these measurements might not normally be displayed when providing measurements only between adjacent edges.

The ability to specify complex rules opens up a large amount of possibilities and flexibility for the user. For example, a user can specify a number of rules in a first set of preferences, in which only particular measurements are displayed which are associated with device features that are essential to be correct at the beginning of the design process and from which all the other device characteristics depend. Once those features are adjusted and solidified, then the user can switch to a second set of preferences that display measurements according to a different set of rules for a later stage in the design process. Thus the user is assisted in only focusing on certain shapes, design features, and measurements needed at different stages of the design process to efficiently create the entire design.

In some embodiments, the complex rules can also be combined with the indicators described above that relate to design requirements (e.g. FIG. 5). For example, only certain measurements can be displayed according to user-specified rules, and of these measurements, different ones are displayed in different colors to indicate different statuses with respect to other user-specified design rules and/or design requirements.

As technology shrinks to smaller dimensions (e.g., 40 nm and below for semiconductor technologies), it is resulting in more complex and dependent design rules. Designers need to keep those in mind during the design phase and it may be a challenge to remember so many design rules. Allowing users to define rules for automatic generation of measurements according to those complex rules would enable them to concentrate on the design task and not have to remember so many rules, thereby improving productivity.

Both the design requirements (e.g., FIG. 5) and the user-specified rules (e.g., FIG. 6) described above are generally described herein as predefined "design rules" where the measurements can be displayed (at least in part) based on a set of such design rules. In device layout embodiments, these design rules can be related to functionality of the design. For example, if the design rules are design requirements providing particular minimum values for distances between objects, characteristics of components, or other needed values to implement the design, these rules relate to technology rules and how the design will function once implemented. If the design rules are user-specified rules for displaying measurements according to complex rules, these rules also relate to displaying measurements according to functionality such as design stages, technology rules, and the final functionality of the design once implemented.

The display of measurements according to such design rules can be provided in a number of different embodiments. For example, design-rule-based display can be used in embodiments in which the system has automatically determined the measurements for design features without manual user input, as described above. In other embodiments, the design-rule-based display can be used for measurements provided in other ways and stored on storage device(s) of the system, such as measurements manually input by a user, received from another system, or otherwise provided.

Measurements to Additional Edges

The displayed measurement examples described above are typically between adjacent edges of shapes in a design. In some embodiments, measurements can also be displayed for additional edges, such as the next adjacent edges to a target shape or edge beyond the directly adjacent edges. For example, this option can enable users to command the system to display measurements for the adjacent and also the "N" next adjacent edges, where N can be a user-defined number. As with the value filter threshold on a per-layer basis (e.g. as in Table 1), the value N can also be defined per layer or layer combination basis. In some cases, the next adjacent edges and measurements will be on the same side of the target shape (as in FIG. 7B below), or can be on different sides of the target shape. Some embodiments can allow a user to specify one or more directions in which the next adjacent edges must be positioned.

Figure 7A:
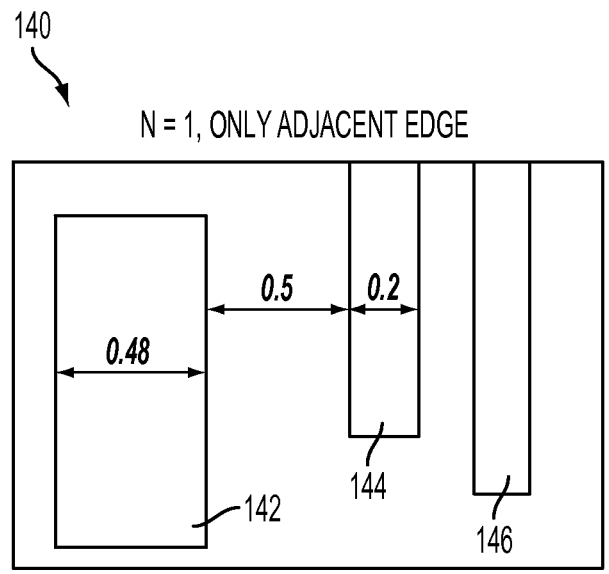
FIGS. 7A and 7B are diagrammatic illustrations of a portion of a design image showing an embodiment for displaying measurements for additional edges.
Figure 7B:
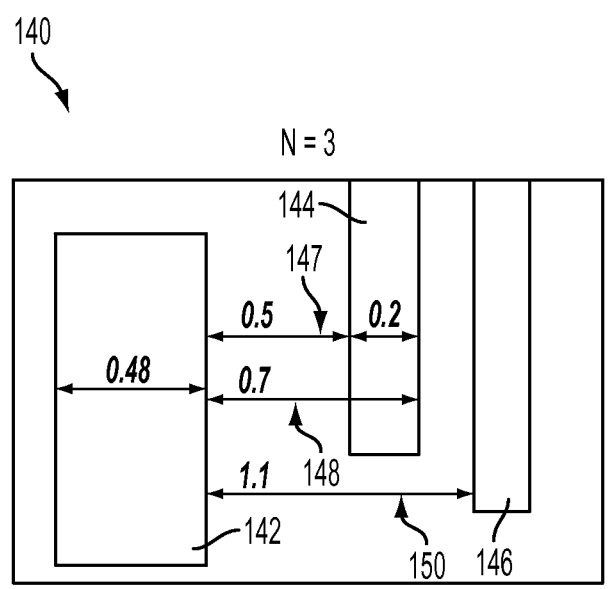

FIGS. 7A and 7B are diagrammatic illustrations of a portion 140 of design image 104 showing an embodiment for displaying measurements for additional edges. FIG. 7A shows example horizontal displayed measurements for N=1, where measurements are displayed only between particular adjacent edges (edge-pairs) in which no other edges exist between the measurements. Horizontal measurements are shown for the width of shape 142, for the spacing between shape 142 and shape 144, and for the width of shape 144.

FIG. 7B shows an example of N=3 assigned to shape 142. For example, N=3 can be assigned to the layer of which shape 142 belongs, or can be assigned to shape 142 in other ways. This indicates that for each shape on that layer, measurements will be displayed for the nearest three parallel adjacent edges to that shape. Thus, in addition to the first measurement 147 (as also shown in FIG. 7A) to the first adjacent edge, a second measurement 148 is displayed between shape 142 and the next (second) nearest adjacent edge, which is the right edge of shape 144. In addition, a third measurement 150 is displayed between shape 142 and the third nearest adjacent edge, which is the left edge of shape 146.

Adjusting Displayed Measurements

The measurements described above are displayed for edges of shapes in a design based on the current positions of the shapes. In some embodiments, the user may adjust the position of shapes or of the edges of a shape. Some embodiments of measurement display can automatically adjust the displayed measurements in accordance with the adjusted shapes, i.e. both the displayed value and the measurement line (or other indicators) of all affected measurements are updated to accommodate the new adjustments.

In one example, measurements have been auto-displayed in the measurement area specified by the user. Now, the user wants to make some modifications to the shapes while keeping in view the measurements that he or she already sees on the screen. After the user makes a modification, this embodiment enables displayed measurements to auto-adjust according to the user modifications done to the edges and/or shapes. This removes any need for the user to delete and redraw the measurements. The modifications to measurements can be performed in real time immediately after any user modification, or can be performed at some point in time, e.g. based on a time period elapsing or receiving a user command.

FIGS. 8A and 8B illustrate one type of modification to a displayed shape and measurements. In FIG. 8A, two shapes 160 and 162 are displayed, and three horizontal measurements are also automatically displayed, including measurement 164 from the right edge of shape 160. The user desires to stretch the shape 160 by dragging the rightmost vertical edge of the shape 160.

In FIG. 8B, the user has stretched the right edge of the shape 160. For example, the user can move a cursor to the right edge using an input device such as a mouse, trackball, stylus, touchscreen, etc., and drag the edge of the shape 160 to the right. The result is the widened shape 160 as shown. According to a feature described herein, the associated displayed measurement 164 has automatically been adjusted based on the new size of the shape 160; e.g., the arrow line has been stretched in accordance with the stretched edge, and the value of the measurement has been accordingly increased. In some embodiments, the displayed measurement 164 changes in real time as the user stretches the edge to the right, e.g., the arrow line right endpoint "sticks to" and drags with the right edge, and the distance value increases to match the current distance and maintains a position centered between the endpoints of the arrow line. An advantage for the user is that he or she can directly adjust a shape to a desired dimension, and does not have to re-size a shape to an arbitrary amount, check the dimensions with a ruler tool, then re-size again, and so on.

FIGS. 9A and 9B illustrate another type of modification to a displayed shape and its displayed measurements. In FIG. 9A, two shapes 170 and 172 are displayed, and three horizontal measurements and one vertical measurement are also shown for this example automatically displayed for the shapes. The shape 172 is provided with displayed horizontal and vertical measurements. The user desires to rotate shape 172 counterclockwise as shown, around a center point of shape 172. In FIG. 9B, the user has rotated shape 172 by 90 degrees counterclockwise. The displayed horizontal and vertical measurements for shape 172 have accordingly been immediately adjusted to the new parallel edges of the shape based on the new orientation of the shape 172. Thus, the horizontal measurement has increased, and the vertical measurement has decreased.

A similar adjustment of the displayed measurements can be provided if a shape is otherwise modified, such as being flipped, increased or reduced in size, divided, etc.

In some cases a shape may be changed or edited such that there are no longer all parallel edges, and one or more edges are angled with respect to the X and Y axes. For example, a shape may be rotated to an arbitrary angle. If a shape is edited such that the two edges that are the endpoints to a displayed measurement are no longer parallel, then the measurement can be auto-adjusted to the closest vertices of the shapes. This helps the user to view the closest distance between the shapes.

Furthermore, if a new shape is introduced into the measurement area where measurements have been displayed, then new measurements are dynamically created between the new shape and the existing shapes in that defined area. If a shape is deleted or is moved outside the measurement area, all displayed measurements associated with that shape are removed automatically. In addition, in some embodiments, a user can optionally define further behavior. For example, if a shape is moved outside the measurement area, then within a certain user-defined distance of that area, the shape is continued to be provided with displayed measurements with respect to the shapes inside the area. This is useful, for example, in cases where a shape of interest has displayed measurements but now has been moved a small, user-defined distance outside the measurement area, and the user is still interested in that shape. Thus the system continues to display measurements for that shape. This allows the user to avoid having to perform an extra step to expand the measurement area to include the moved shape, and hence also avoids creating unnecessary measurements for the additional surrounding shapes in which user is not interested. However, if the shape is moved beyond the user-defined distance from the measurement area, then it implies that user is no longer interested in having measurements displayed for this shape and hence the measurements to that shape are automatically removed.

Another feature for the displayed measurements is "smart editing," which enables the user to directly edit the value of a measurement as displayed on the screen or other display device, and to change the design as a result of the value edits. For example, measurements are displayed in the measurement area specified by the user, and the user then wants to space two shapes apart by 0.6 units that are currently 0.3 units apart as indicated by a displayed measurement. The user changes the 0.6 value directly to 0.3, e.g., by moving a cursor onto the value and entering the desired number via an input device. After the user performs the desired edits, the measurement line of the displayed measurement is stretched and the shapes are automatically positioned apart by 0.6 units.

By default in some embodiments, after the user changes a measurement value, both the edges at the endpoints of that measurement are moved by the same amount, which is half the change in value, i.e., the delta divided by 2 for each edge. In some embodiments, the user can have a choice as to which edge(s) are moved and by how much. For example, if the user enters or edits the value, the system can ask the user to specify the manner in which he or she wants the measurement and shape adjustment to be performed. The user can specify, for example, that the left or top edge is only to be moved, the right or bottom edge is only to be moved, or both edges are to be moved an equal amount (or the movement amount for each edge can be specified by the user).

Some embodiments can take additional considerations into account based on the current shape and its surroundings in the design. If one of the two edges of a displayed measurement has no additional measurements to other edges (a "free edge"), while the other of the two edges has one or more other measurements to other edges (a "dependency edge"), then the system can by default select the free edge to be moved after the user has edited the value of that displayed measurement. The user can also set a preference as to which edge is moved. In other words, when the user directly edits a measurement value, the measurement tool is intelligent enough to automatically adjust the associated edge which has no other measurement attached to it, and not disturb an edge that has another measurement attached to it. An advantage is that the user does not need to manually modify any shapes or other measurements; if the user knows the spacing value needed, the user simply edits the measurement value, and the measurement and shape is automatically modified according to the entered value.

Modes for Displayed Measurement Generation

Various modes can be employed for the measurement area in which displayed measurements are generated for shapes in a design. Each mode may be useful in different contexts or based on different tasks that the user needs to perform. Three modes described below include a resizable measurement area, multiple measurement areas, and a measurement area under a cursor.

Figure 10:
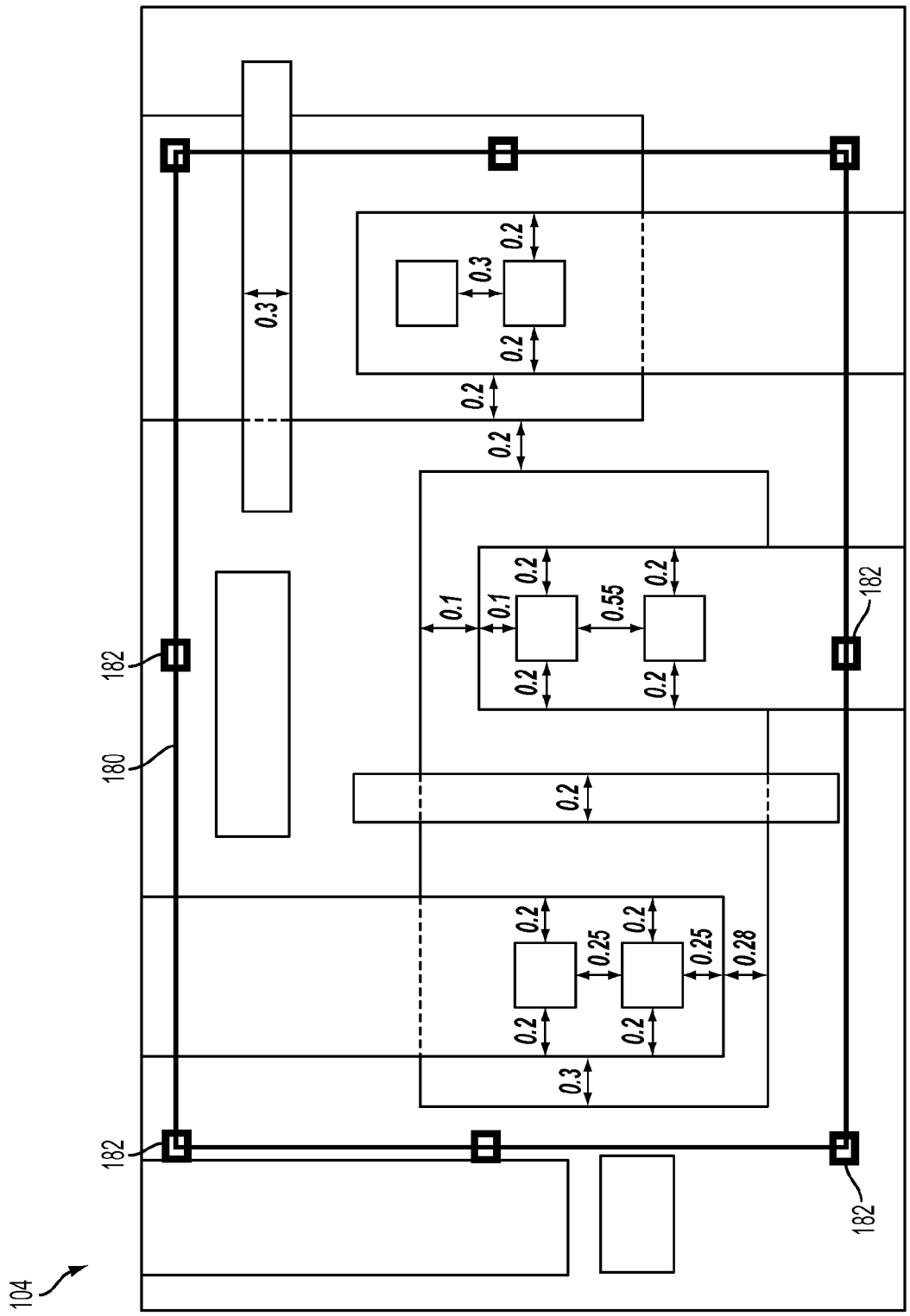
FIG. 10 is a diagrammatic illustration of an example of a design image after the user has dragged a bounding box to create a displayed measurement area.

In a resizable measurement area mode, the measurement area can be specified and resized by the user. For example, as described above, the user can drag a bounding box using an input device to specify the measurement area. In some embodiments, after the user releases the dragging operation to specify the area, the bounding box of the area continues to be displayed on the screen. FIG. 10 shows one example of the image 104 after the user has dragged a bounding box to create a displayed measurement area 180. Other embodiments can provide a bounding box or other area perimeter in a variety of different shapes and/or user-defined configurations.

The bounding box of area 180 includes "stretch handles" 182 that can be selected by a user-controlled cursor to resize and/or move the measurement area 180. For example, the user can select the stretch handles and drag the edges of the measurement area to change its size. If the size is decreased and some displayed measurements end up outside the measurement area, those measurements are automatically removed from the display. If the size is increased to include more shapes and/or edges, then additional measurements are automatically generated and displayed incrementally between the newly included edges inside the measurement area. Further, the user can move a selected measurement area 180 from one location of the design canvas to another location, which causes the displayed measurements no longer inside the measurement area to be removed, and new measurements to be displayed where the area is now located.

Figure 11:
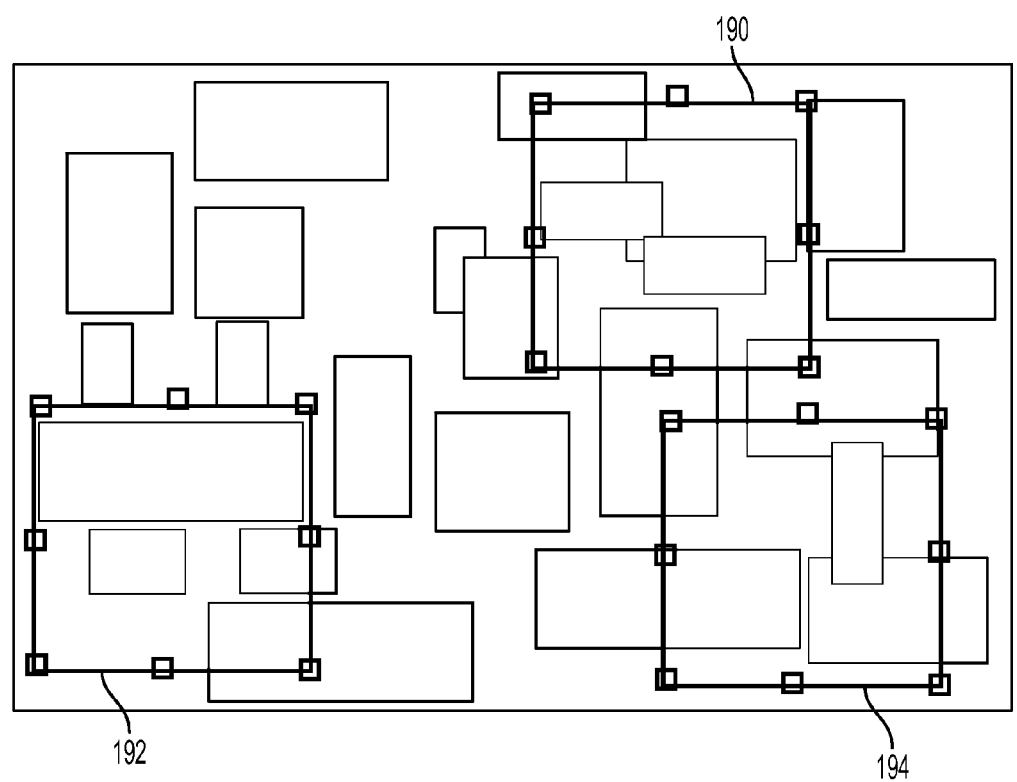
FIG. 11 is a diagrammatic illustration of providing multiple defined measurement areas in a portion of a design canvas.

FIG. 11 illustrates a mode providing multiple defined measurement areas in a portion of a design canvas, in which the user can specify multiple measurement areas at different locations of the design canvas. For example, measurement areas 190, 192, and 194 are defined at different locations of the overall design, where the user can zoom in on any of the areas to see the displayed measurements for shapes in the area. A user can create additional measurement areas at any desired time.

In some embodiments the user can choose to delete specific or multiple measurement areas along with all the measurements generated inside them, or can choose to delete only the measurement area bounding box and keep the generated measurements already displayed inside that area (however, any changes to the shapes in that area would not change any of the displayed measurements because a measurement area is no longer defined there).

Figure 12A:
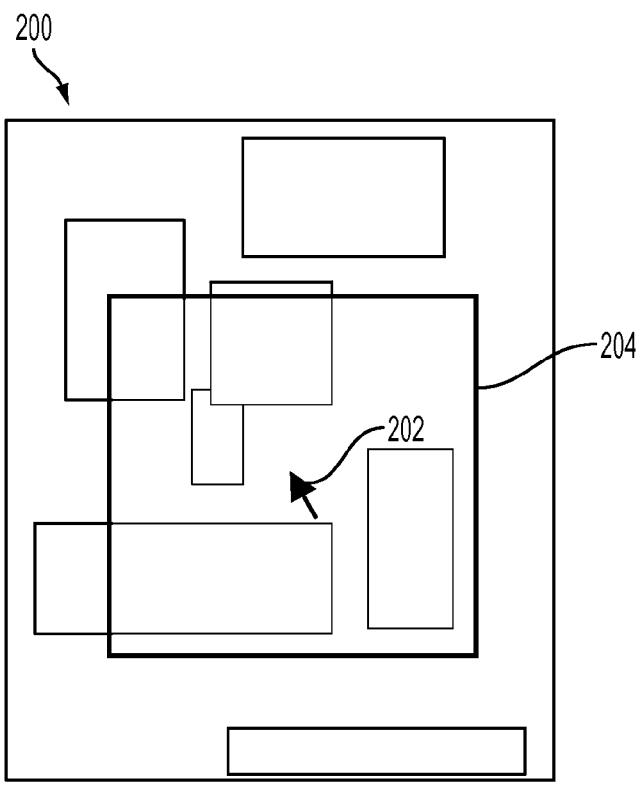
FIGS. 12A and 12B are diagrammatic illustrations of providing a measurement area relative to a cursor.

FIG. 12A illustrates a mode providing a measurement area relative to a cursor in a portion 200 of a design canvas. A user-controlled cursor 202 is displayed and a measurement area 204 is defined relative to the cursor 202, where measurements are displayed for the shapes or edges within the area 204 at its current location. The measurement area 204 is provided at the current location of the cursor. The area 204 can be provided as centered on the cursor tip as shown, or in other embodiments can be provided in some other spatial relation to the cursor. The predefined area 204 can be of variable size and variable shape and can be user-defined. For example, the area 204 can be rectangular, circular, or some other shape as defined by user. The size (for example, a radius for a circular area 204), can also be specified by the user.

In some embodiments, measurements are displayed in the cursor-controlled measurement area 204 in response to the user stopping movement of the cursor. For example, the measurements can be displayed within the area 204 only after the cursor has stayed stationary (or approximately stationary or hovering) for at least T seconds at one location (e.g., within a threshold number of pixels of a single location), where T and/or other settings can be configured by a user. In other embodiments, the measurements can be displayed and updated continuously based on the current cursor location. This may introduce some shaky movement or jitter in the positions of the measurements when the cursor makes small movements; thus, in some embodiments, measurements are only displayed at new positions of the cursor if the cursor has been moved a user-configurable threshold distance from its last position.

Figure 12B:
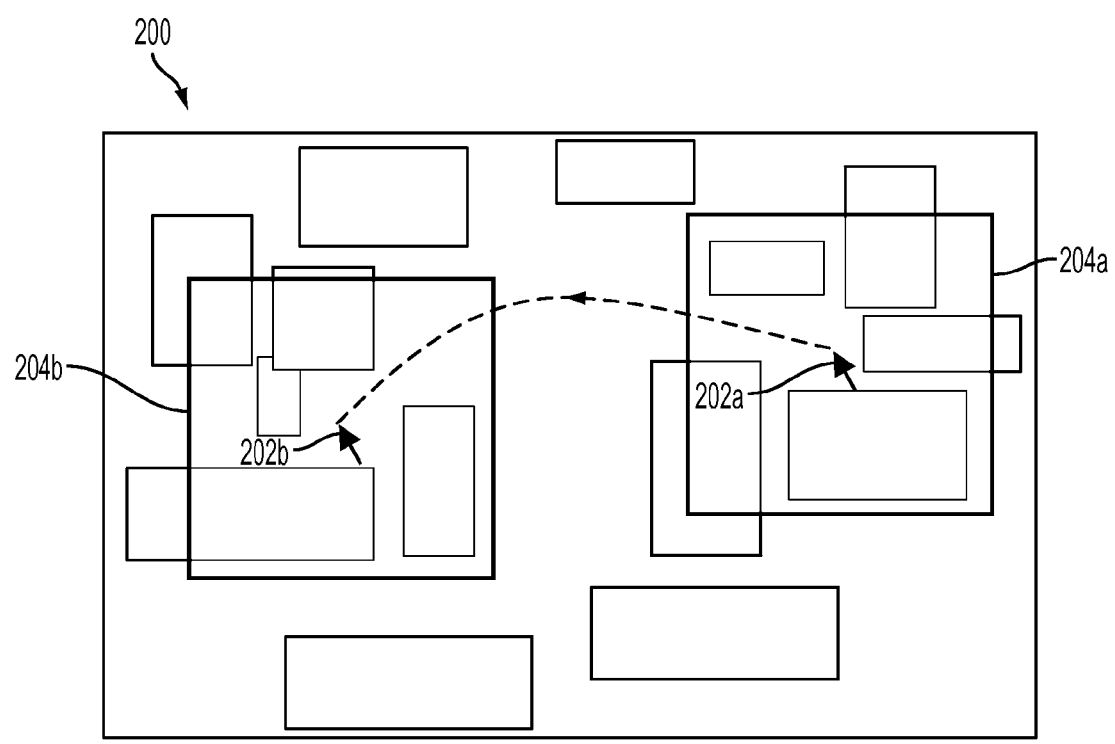

FIG. 12B illustrates the movement of the cursor 202 and the corresponding movement of the cursor-controlled measurement area 204. The cursor 202*a* and measurement area 204*a* is at a first location of the design canvas where measurements are displayed for shapes within the area 204*a*. Then the cursor is moved to the left to a different location on the canvas and is shown as cursor 202*b* and area 204*b*, where measurements are then generated and displayed for shapes within the area 204*b*. In some embodiments the user can select whether or not to keep the displayed measurements that were generated in previous locations of the cursor, e.g., the last X previous locations as specified by the user.

As to determining whether a measurement is inside a measurement area and should be displayed, different embodiments can use different methods as described above with respect to FIG. 3 and the defined measurement area 110.

Further Reducing On-Screen Clutter from Displayed Measurements

The automatic display of measurements as described herein can produce a large number of measurements in a design. In some cases, there are a large number of shapes in the design, and/or the shapes are closely spaced, which can cause displayed measurements to overlap edges or shapes, overlap other measurements, or create other visual clutter or congestion and user confusion.

Some features described above can reduce the clutter of displayed measurements, such as filtering out the display of some measurements as desired by the user. Another feature that can reduce the overlap of measurement lines with shapes and other lines is the use of extended measurement lines, or "construction lines." These are useful for providing measurements for distances that are too small to display measurement lines and/or values, or which overlap other measurements or shapes.

Figure 13:
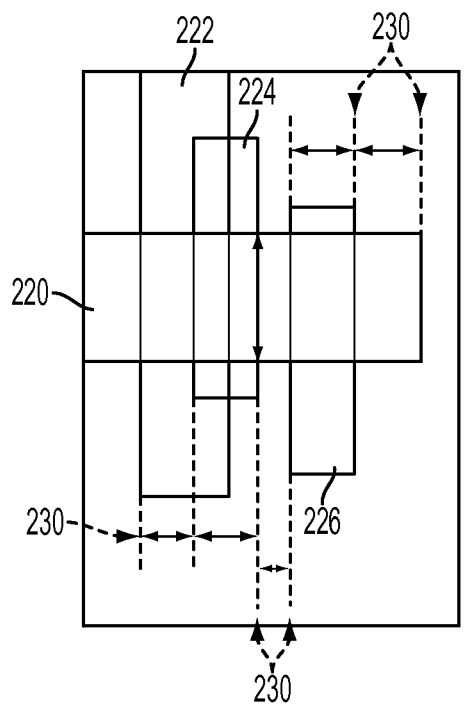
FIG. 13 is a diagrammatic illustration of the use of extension lines for displayed measurements.

FIG. 13 illustrates the use of extension lines or "construction lines" for displayed measurements in an example having several shapes within close proximity in a design. Shapes 220, 222, 224, and 226 are small and overlapping or closely positioned to each other, such that measurements displayed at locations between the edges of the shapes creates clutter or confusion. Thus, extension lines can be used to effectively extend the edges past the perimeter of the shapes to display some measurements in a more clear location. Thus, for example, vertical extension lines 230 extend out parallel to their associated edges, in approximately the same X position as the edges (or approximately the same Y position for horizontal extension lines, not shown). A measurement is displayed between the extension lines 230 instead of between the associated edges. For example, the measurement can be displayed mid-way along the length of the extension lines, or at a threshold distance from the associated shape.

Whether or not to display a measurement with extension lines can be determined in a variety of ways. For example, if a measurement line would cross an edge of a shape or cross another measurement, then extension lines can be used to avoid that situation. In some embodiments when there is not enough room to display a measurement line between edges or extension lines, two smaller measurement lines can be displayed on opposite sides of the edges or extension lines which point into the measured region.

The distance which the measurement lines, or the extension lines, are displayed beyond the nearest shape edge or shape border can be controlled by the user, e.g., by clicking an icon or pressing a bindkey, each click or press moving out (or alternatively, moving in) the measurement lines or extension lines.

Figure 14:
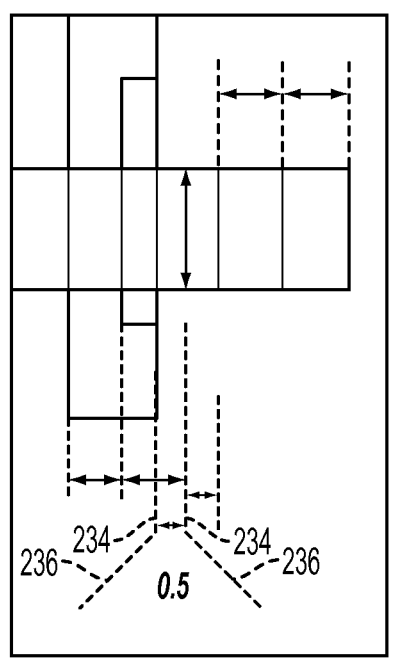
FIG. 14 is a diagrammatic illustration of another example of using extension lines to display measurements, including angled portions of the extension lines.

FIG. 14 illustrates another example of using extension lines to display measurements, including angle portions of the extension lines. In some cases, the space between the extension lines is not large enough to display a measurement line and/or a value without a confusing overlap of a portion of the measurement with another portion of the measurement, or an overlap with shapes or other measurements. In such cases, the extension lines can include an angled portion that is made to diverge in opposing directions away from the center between the extension lines, such that sufficient space is created for display of the measurement. For example, in FIG. 14 the extension lines 234 are spaced closely together such that neither measurement lines nor value can be displayed between them. The system thus displays diverging extension line portions 236 positioned at the ends of the extension lines 234 which creates more space between the lines 236 and allows a value "0.5" to be displayed between them.

Whether to use diverging portions of the extension lines can be controlled by a ratio of the width of the measurement value to the width of the space between the extension lines (without diverging portions); if the ratio is beyond a predetermined threshold, then diverging portions of the lines can be added. The angles of the diverging lines can be based on the size of the value that needs to be displayed between those lines, so that a long or large value will cause greater divergence of the lines.

Another feature that can be used in some embodiments to reduce screen clutter is a magnifier for measurements. For example, a particular measurement, e.g. for a small distance, can be displayed as very small, including its measurement line and value. To view the measurement, the user can hover the controlled cursor over the measurement (or provide other user input selecting that measurement) which causes a magnified view of that measurement to be displayed over the originally-sized measurement, or displayed in a different area of the display screen. Similarly, the cursor can be hovered or other user input provided to magnify multiple measurements within a user-designated area of the design. In some embodiments, hovering the cursor (or otherwise magnifying the measurement) causes the measurement to be shown in the magnified view with diverging portions to extension lines as described above.

Overall, the de-cluttering techniques described herein can be used to greatly enhance the usability of displayed measurements, especially in complex designs. In general, the display of measurements can be caused to avoid overlap with any portion of a measurement or shape. In some embodiments, the display of measurements can be filtered or adjusted so that only some of the possible measurements between adjacent edges are displayed.

Figure 15:
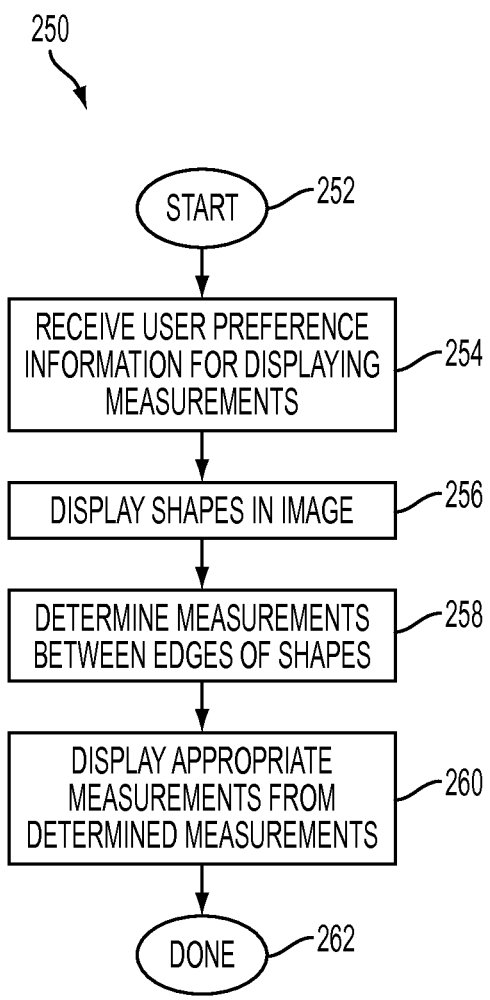
FIG. 15 is a flow diagram illustrating an example of a method for displaying measurements for graphical shapes in a graphical design.

FIG. 15 is a flow diagram illustrating one example 250 of a method for displaying measurements for graphical shapes in a graphical design. Method 250 can be implemented, for example, by the components in system 20, including one or more CPUs/processors and a display device 26. Method 250 can be implemented by program instructions or code, which can be stored on a computer readable medium. Alternatively, the method 250 can be implemented in hardware (logic gates, etc.), or in a combination of hardware and software. It should be noted that the steps described below can be performed in a different order than shown and/or simultaneously (partially or completely) with other steps, where appropriate.

The method begins at 252, and in step 254, user preference information for displaying measurements is optionally received or determined, e.g. from a user. Many user-specified preferences can be included in various embodiments. For example, the user can be allowed to turn on or off and specify ranges or values for various smart filtering options described above, and/or other options such as displaying indicators related to design requirements, displaying multiple measurements with respect to edges on a particular layer, the particular mode of measurement display, etc. In one example, the user can define a threshold measurement size for which a shape must qualify to have its associated measurement displayed, or a preference to display measurements for shapes within a user-specified percentage of design requirement values. In some embodiments, the user can specify other characteristics of the measurements, such as font, color, style, etc. The user has a large number of options which can be specified in any number of rules.

In step 256, the appropriate shapes are caused to be displayed in the image 104 (along with any other features or details of the image and interface). Displayed image 104 can be a complete image or part of a complete image or canvas, depending on the zoom level of the interface and graphical application.

In step 258, measurements are automatically determined between edges for one or more of the shapes in the image 104 by one or more processors of the computer system. In some embodiments, the determination of measurements is based on appropriate user preferences, and in some cases this results in measurements not being determined for all edges and/or shapes. For example, if the user has input one or more defined measurement areas in which measurements are to be displayed, then measurements for shapes and/or edges outside these defined areas need not be determined until such measurements are required for display (or required for another reason, such as to determine results of user preferences). In another example, if a filter has been selected to cause the display of only horizontally-oriented measurements, then the vertical measurements need not be determined at the current time. Other user-specified rules may cause only some measurements to be determined. In other embodiments, all the measurements in the design can be determined (or all the measurements within the specified measurement areas can be determined) regardless of user preferences, and the display of the measurements is filtered subsequently if appropriate. In any case, some types of user preferences can typically only be applied after a determination of measurements has been performed, such as filtering of measurement display based on the distance value of the measurement.

In step 260, the process determines which of the measurements to display and displays those measurements on the display screen. Depending on the embodiment used, this step can include checking characteristics of shapes, measurements, or other design features to apply particular user preferences that affect the display of measurements. For example, if the user has specified a filter that only displays measurements within a particular range, then the measurement magnitudes are checked and only qualifying measurements are displayed. Particular display modes, such as measurements under cursor mode, will cause only some measurements to be displayed based on current cursor position. An option that causes construction lines to be displayed where appropriate will cause the process to determine which measurements are to be displayed with construction lines. Other options include the other various embodiments and options described herein. The process is then complete at 262.

The process described above can also be used if measurements are currently being displayed but the user makes changes to the design that require an update to the displayed measurements, such as adjusting a shape, changing a preference or rule, etc. The adjustments to shapes can be performed in step 256, and the measurements that need to be updated can be determined in step 258 and displayed in step 260.

Connectivity Embodiments for Displayed Measurements

The displayed measurements described herein can also be used based on connectivity of shapes or components within a design. In some applications related to integrated circuits (ICs), the IC design phase can be broadly divided into 3 domains: the connectivity domain, where the connectivity between design entities is specified; the layout domain, where the actual shapes are created; and the design rules domain, where the design is adhered to design rules as specified by the process manufacturing requirements. The automatically displayed measurements described above relate to the layout domain and design rules domain, but can also be used within the connectivity domain. Connectivity provides an underlying connection structure to shapes or components in a design, and specifies connections of the shapes (or other components) to each other or to other shapes (or other components) of the design or of one or more other designs. For example, electrical connectivity in an electrical circuit design indicates which shapes/components are electrically connected to which other shapes/components of the design. In some embodiments, connectivity can be implemented at least in part by using netlists or other specifications that specify the connections (or nets, particular sets of connections) and signals provided between various identified components. The displayed measurements can be displayed at least in part based on the connectivity of the shapes. Any of the embodiments described above can be used with respect to connectivity, including conditions, rules, filters, modes, and reduction of displayed clutter.

For example, users can specify the nets and signals on which displayed measurements should be generated inside a user-defined area, and the displayed measurements are generated only between edges that belong to shapes having that connectivity. In one example, the user specifies "VDD" and "CLOCK", such that only shapes that carry the VDD and CLOCK signals (i.e. their connectivity is VDD and CLOCK) will have the auto-measurements displayed between their adjacent edges. In another example, the user can color-code displayed measurements according to connectivity, where different connectivity or nets can be assigned different colored displayed measurements. For example, power nets such as VDD and GROUND can have measurements displayed in red, general signal measurements in blue, and CLOCK net measurements in green.

Furthermore, conditional rules relating to connectivity can be specified. For example, the user can specify to display auto-measurements if there is structural overlap, enclosure, etc. between shapes belonging to a specified connectivity. In one example, the user can specify that if a shape of connectivity CLOCK_1 overlaps with a shape of connectivity CLOCK_2, then the auto-measurements are generated and displayed for the dimensions of the overlapped zone.

A user can also specify a combination of distance and connectivity as conditions for measurement display. For example, if the distance between two VDD nets is below 0.5 micron, only then display the measurements. The filtering mechanisms described above also can be used with combinations of layers and connectivity. For example, measurements can be displayed for shapes on a specified layer, such as METAL_1, and which have a connectivity of GROUND.

The measurements also can be automatically updated based on changes with respect to connectivity. In one example, measurements are created and displayed only for all shapes that have VDD connectivity. The user then updates the connectivity of one of the shapes from the PWR net to the VDD net, and updates the connectivity of a second shape from VDD to PWR. Immediately the measurements are updated on the display, such that measurements are newly displayed between the first shape VDD and adjacent shapes, and measurements are removed for the second shape since it no longer has VDD connectivity.]

Some embodiments can combine various features of the inventions described herein. For example, the flexible smart filtering can be used in combination with a display mode and design requirement indication. Many user-specified preferences and options can be included in various embodiments. For example, the user can be allowed to turn on or off the automatic display of measurements using a control of the interface. When auto-measurements are off, the user could opt to manually add measurements to shapes. Other features of the present inventions, such as filtering, editing, adjustment, display modes, and rules, can be used with such manually-input measurements.

Embodiments of displayed measurements described herein have several advantages for designers using design tools and software. Measurements can be displayed automatically as per user specifications or preferences, which avoids the need for the user to draw measurements manually and greatly reduces zoom operations, thereby greatly increasing productivity. Flexible smart filtering for displaying only desired measurements provides the user with flexibility and reduces screen clutter, as well as enabling the user to perform complex thresholding based on spacing, layers, and/or direction. Filtering or indicators also enables the display of measurements to be based on or aware of design requirements such as DRC requirements. Displaying measurements based on user-defined complex rules assists the user greatly when designing within complex rules and requirements. These features help the user achieve the desired design objective much faster.

Additional features include measurements that are automatically updated in response to shapes being modified allowing the user to avoid having to manually update measurements, and measurement area modes that allow the user to select a mode that will display measurements in a way suitable and efficient for the user's current task. De-cluttering techniques such as extension lines and tied magnifiers can be used to reduce screen clutter as needed. The features described herein can be combined together in various combinations or used separately or independently, as appropriate to particular embodiments. For example, some features such as filtering measurement display, using design rules, and/or reducing clutter of measurements on the display can be used with or without the automatic determination of measurements described above.

Although the present inventions have been described in accordance with the embodiments shown, one of ordinary skill in the art will readily recognize that there could be variations to the embodiments and those variations would be within the spirit and scope of the present inventions. Accordingly, many modifications may be made by one of ordinary skill in the art without departing from the spirit and scope of the appended claims.

What is claimed is:

1. A method for displaying measurements in a graphical design using a computer system, the method comprising:
   causing a display of an image on a display device, wherein a plurality of shapes are displayed in the image;
   receiving from a user a definition of a defined area of the image and user-provided input indicating one or more shape characteristics and one or more selected measurement display options associated with the one or more shape characteristics;
   determining, with a processor, one or more measurements for one or more of the shapes displayed within the defined area, the one or more measurements determined automatically without a user designating endpoints for the measurements; and
   causing generation and display of the one or more measurements on the display device, the one or more measurements displayed as being associated with the one or more shapes, wherein the display of the one or more measurements is configured based on checking, for each of the plurality of shapes, the one or more shape characteristics and the one or more selected measurement display options indicated in the user-provided input,
   wherein each of the one or more measurements include at least one measurement line drawn between two edges of one or more shapes and a indicator of a magnitude of the distance between the two edges to be displayed in relation to the one or more selected display options, and,
   wherein the one or more measurements include at least one measurement displayed each with an associated plurality of extension lines that are extended from edges of one or more shapes, wherein the at least one measurement each includes a measurement line displayed between the associated plurality of extension lines, and
   wherein the extension lines include at least one angled portion that diverges in opposing directions away from a center between the extension lines.

2. The method of claim 1 wherein the defined area of the image in which the measurements are determined is a portion of the image that does not include all of the plurality of shapes.

3. The method of claim 1 wherein the design is a circuit layout design and the one or more shapes are regions or traces in the circuit layout design, and wherein the indicator of magnitude is a value indicating a number of units of distance of the associated measurement.

4. The method of claim 1 wherein the one or more selected measurement display options include measurement display filtering, wherein the display of the one or more measurements includes displaying a predetermined set of the determined measurements and excluding at least one determined measurement from display based on the one or more shape characteristics and the selected measurement display options.

5. The method of claim 4 wherein the one or more shape characteristics include at least one of the following: the magnitude of distances between the shapes being within a predetermined range, the shapes associated with the displayed measurements being on one or more predetermined layers of the design, and the shapes meeting at least one threshold in a set of spatial design requirements for the design.

6. The method of claim 1 wherein the one or more selected measurement display options include display of compliance with a set of spatial design requirements for the design, and wherein the display of the one or more measurements includes displaying an indication with each measurement indicating whether or not that measurement meets the set of spatial design requirements for the design.

7. The method of claim 6 wherein the indication includes displaying the measurement in a first color in response to the measurement meeting the set of spatial design requirements, and displaying the measurement is in a second, different color in response to the measurement not meeting the set of spatial design requirements.

8. The method of claim 6 wherein the set of spatial design requirements includes at least one minimum distance that is to be provided between qualifying shapes of the one or more shapes.

9. The method of claim 1 wherein the one or more selected measurement display options includes displaying a plurality of measurements, each between a particular edge and a user-specified number of multiple adjacent edges at different distances to the particular edge.

10. The method of claim 1 further comprising:
    adjusting one of the shapes based on user input,
    adjusting with the processor the measurements associated with the adjusted shape, and
    adjusting with the processor the display of the associated measurements to correspond to the adjusted shape.

11. The method of claim 1 further comprising receiving an edit from a user to the displayed magnitude of a particular measurement, and automatically adjusting the measurement line of the particular measurement and adjusting the one or more shapes associated with the particular measurement to accommodate the edit.

12. The method of claim 1 wherein the one or more shape characteristics include at least one of: a distance between the shapes, a size of the shapes, a spatial dimension of the shapes, an electrical connectivity between the shapes, and whether the shapes meet one or more design requirements.

13. The method of claim 1 wherein the defined area is a first portion of the image smaller than the entire image, and further comprising receiving a definition of at least one additional defined area that is a second portion of the image smaller than the entire image, and determining and displaying one or more measurements only for shapes displayed within each of the defined areas.

14. The method of claim 1 wherein the definition of the defined area of the image is an area displayed relative to a cursor having a displayed position controlled by a user using an input device, such that a position of the defined area is based on the position of the cursor.

15. The method of claim 1 wherein the graphical design is a circuit design, and wherein the measurements are displayed at least in part based on an specified electrical connectivity of the one or more shapes, the electrical connectivity specifying electrical connections of the one or more shapes to each other or to other components of the design, wherein the display of the measurements includes:
    displaying the measurements to show an indication of the electrical connectivity of the one or more shapes, or
    excluding at least one of the measurements from display based on the electrical connectivity of one or more shapes associated with the excluded at least one measurement.

16. A method for displaying measurements in a graphical design using a computer system, the method comprising:
    causing a display of an image on a display device, wherein a plurality of shapes are displayed in the image;
    receiving from a user a definition of a defined area of the image and user-provided input indicating one or more shape characteristics and one or more selected measurement display options associated with the one or more shape characteristics;
    determining, with a processor, one or more measurements for one or more of the shapes displayed within the defined area, the one or more measurements determined automatically without a user designating endpoints for the measurements; and
    causing display of the one or more measurements on the display device, the one or more measurements displayed as being associated with the one or more shapes, wherein the display of the one or more measurements is configured based on checking, for each of the plurality of shapes, the one or more shape characteristics and the one or more selected measurement display options indicated in the user-provided input,
    wherein each of the one or more measurements include at least one measurement line drawn between two edges of one or more shapes and a displayed indicator of a magnitude of the distance between the two edges,
    wherein the one or more measurements include at least one measurement displayed each with an associated plurality of extension construction lines that are extended from edges of one or more shapes, wherein the at least one measurement each includes a measurement line displayed between the associated plurality of construction lines, and,
    wherein the construction lines include diverging angled portions that create a greater distance between the construction lines in which to display the indicator of magnitude of the measurement.

17. A computer program product comprising a computer readable medium including program instructions to be implemented by a computer and for displaying shape information in a graphical interface, the program instructions for:
    causing a display of an image on a display device, wherein a plurality of shapes are displayed in the image;
    receiving from a user a definition of a defined area of the image and user-provided input indicating one or more shape characteristics and one or more selected measurement display options associated with the one or more shape characteristics;
    determining, with a processor, one or more measurements for one or more of the shapes displayed within the defined area, the one or more measurements determined automatically without a user designating endpoints for the measurements; and
    causing, with the processor, display of the one or more measurements on the display device, the one or more measurements displayed as being associated with the one or more shapes, wherein the display of the one or more measurements is configured based on checking, for each of the plurality of shapes, the one or more shape characteristics and the one or more selected measurement display options indicated in the user-provided input,
    wherein each of the one or more measurements include at least one measurement line drawn between two edges of one or more shapes and a displayed indicator of a magnitude of the distance between the two edges,
    wherein the one or more measurements include at least one measurement displayed each with an associated plurality of extension construction lines that are extended from edges of one or more shapes, wherein the at least one measurement each includes a measurement line displayed between the associated plurality of construction lines, and,
    wherein the construction lines include angled portions that diverge in opposing directions away from a center between the extension lines.

18. The computer program product of claim 17 wherein the one or more selected measurement display options include measurement display filtering, wherein the display of the one or more measurements includes displaying a predetermined set of the determined measurements and excluding at least one determined measurement from display based on the one or more shape characteristics and the selected measurement display options.

19. The computer program product of claim 17 the one or more shape characteristics include at least one of: a distance between the shapes, a size of the shapes, a spatial dimension of the shapes, an electrical connectivity between the shapes, and whether the shapes meet one or more design requirements.

20. A system for displaying shape information in a graphical interface using a computer system, the system comprising:
    a memory; and
    a processor in communication with the memory, the processor:
    causing a display of an image on a display device, wherein a plurality of shapes are displayed in the image;
    receiving from a user a definition of a defined area of the image and user-provided input indicating one or more shape characteristics and one or more selected measurement display options associated with the one or more shape characteristics;

determining one or more measurements for one or more of the shapes displayed within the defined area, the one or more measurements determined automatically without a user designating endpoints for the measurements; and causing display of the one or more measurements on the display device, the one or more measurements displayed as being associated with the one or more shapes, wherein the display of the one or more measurements is configured based on checking, for each of the plurality of shapes, the one or more shape characteristics and the one or more selected measurement display options indicated in the user-provided input, wherein each of the one or more measurements include at least one measurement line drawn between two edges of one or more shapes and a displayed indicator of a magnitude of the distance between the two edges, wherein the one or more measurements include at least one measurement displayed each with an associated plurality of extension construction lines that are extended from edges of one or more shapes, wherein the at least one measurement each includes a measurement line displayed between the associated plurality of construction lines, and, wherein the construction lines include angled portions that diverge in opposing directions away from a center between the extension lines.

21. The system of claim 20 wherein the one or more selected measurement display options include measurement display filtering, wherein the display of the one or more measurements includes displaying a predetermined set of the determined measurements and excluding at least one determined measurement from display based on the one or more shape characteristics and the selected measurement display options.

22. The system of claim 20 wherein the one or more shape characteristics include at least one of: a distance between the shapes, a size of the shapes, a spatial dimension of the shapes, an electrical connectivity between the shapes, and whether the shapes meet one or more design requirements.

23. A method for displaying measurements in a graphical circuit design using a computer system, the method comprising:

causing a display of an image on a display device, wherein a plurality of shapes are displayed in the image;

storing one or more measurements for one or more associated shapes of the plurality of shapes; and causing, with a processor, display of at least one measurement of the one or more measurements on the display device, wherein the display of the at least one measurement is based at least in part on a set of predefined design rules for the design, wherein the predefined design rules include a set of spatial design requirements for circuit functionality of the circuit design, and wherein the display of the at least one measurement is based at least in part on whether or not the one or more associated shapes meet the set of spatial design requirements, wherein each of the one or more measurements include at least one measurement line drawn between two edges of one or more shapes and a displayed indicator of a magnitude of the distance between the two edges, wherein the one or more measurements include at least one measurement displayed each with an associated plurality of extension construction lines that are extended from edges of one or more shapes, wherein the at least one measurement each includes a measurement line displayed between the associated plurality of construction lines, and, wherein the construction lines include angled portions that diverge in opposing directions away from a center between the extension lines.

24. The method of claim 23 wherein each of the one or more measurements include a displayed indicator of a magnitude of the distance between two edges of the one or more shapes, wherein the one or more shapes are regions or traces in the circuit design, and wherein the indicator of magnitude is a value indicating a number of units of distance of the associated measurement.

25. The method of claim 23 wherein further comprising receiving from a user a definition of a defined area of the image and user-provided input indicating one or more shape characteristics and one or more selected measurement display options associated with the one or more shape characteristics, wherein the display of the at least one measurement is configured based on checking, for each of the plurality of shapes, the one or more shape characteristics and the one or more selected measurement display options indicated in the user-provided input.

26. The method of claim 23 wherein the set of spatial design requirements includes at least one minimum distance threshold indicating a minimum distance that is to be provided between qualifying shapes of the one or more shapes.

27. The method of claim 26 further comprising receiving user input that specifies a user-defined threshold as a percentage of at least one of the predetermined thresholds in the set of spatial design requirements.

28. The method of claim 23 wherein the display of the at least one measurement includes filtering the display, including:

displaying the at least one measurement if the at least one measurement meets the set of spatial design requirements, and excluding the at least one measurement from display if the at least one measurement does not meet the set of spatial design requirements.

29. The method of claim 23 wherein the display of the one or more measurements includes displaying an indication with each of the at least one measurement, the indication indicating whether or not that measurement meets the set of spatial design requirements for the design.

30. The method of claim 29 wherein the indication includes displaying the measurement in a first color, wherein the first color indicates that the measurement meets the set of spatial design requirements, and wherein the measurement is displayed in a second, different color to indicate that the measurement does not meet the set of spatial design requirements.

31. The method of claim 23 wherein the design rules designate particular displayed portions of the design for which to display measurements, the particular portions being portions which the user is to focus on, and wherein other displayed portions of the design not designated by the design rules are not provided with displayed measurements.

32. The method of claim 31 wherein the particular displayed portions include at least one of: overlapping areas of two or more shapes of the design, features of the design provided within a threshold distance of each other, and shapes having a predetermined type.

33. The method of claim 23 wherein the design rules indicate particular displayed portions of the design for which to display measurements in a first color, the particular portions being portions which the user is to focus on, and wherein other displayed portions of the design not indicated by the design rules are displayed in a second, different color.

* * * * *